(12) United States Patent
Yamaguchi

(10) Patent No.: US 8,304,815 B2
(45) Date of Patent: Nov. 6, 2012

(54) SOLID-STATE IMAGE PICKUP APPARATUS AND METHOD OF MANUFACTURING THE SAME

(75) Inventor: Shinpei Yamaguchi, Tokyo (JP)

(73) Assignee: Sony Corporation (JP)

( * ) Notice: Subject to any disclaimer, the term of this patent is extended or adjusted under 35 U.S.C. 154(b) by 278 days.

(21) Appl. No.: 12/660,286

(22) Filed: Feb. 24, 2010

(65) Prior Publication Data

US 2010/0224917 A1 Sep. 9, 2010

(30) Foreign Application Priority Data

Mar. 6, 2009 (JP) ................................ P2009-053082

(51) Int. Cl.
*H01L 27/148* (2006.01)
(52) U.S. Cl. ................. 257/228; 257/233; 257/E31.102
(58) Field of Classification Search .................. 257/228, 257/E31.102
See application file for complete search history.

(56) References Cited

U.S. PATENT DOCUMENTS

2006/0125038 A1 * 6/2006 Mabuchi ....................... 257/447
2008/0170149 A1 7/2008 Iida et al.

FOREIGN PATENT DOCUMENTS

JP 2008-172580 A 7/2008
* cited by examiner

*Primary Examiner* — Daniel Whalen
(74) *Attorney, Agent, or Firm* — Lerner, David, Littenberg, Krumholz & Mentlik, LLP

(57) ABSTRACT

Disclosed is a solid-state image pickup apparatus including a semiconductor substrate, a photoelectric converter, a transfer gate, an insulating layer, a first silicon layer, and a pixel transistor portion. The photoelectric converter converts light energy of incident light into electrical energy and obtains a signal charge. The photoelectric converter is formed on a surface side in the semiconductor substrate. The transfer gate reads the signal charge from the photoelectric converter, and the transfer gate is formed on the semiconductor substrate adjacent to the photoelectric converter. The insulating layer is formed on the photoelectric converter in the semiconductor substrate. The first silicon layer is formed on the insulating layer. The pixel transistor portion amplifies and outputs the signal charge read by the transfer gate. The pixel transistor portion is formed on the insulating layer with the first silicon layer being an active region.

4 Claims, 38 Drawing Sheets

SOLID-STATE IMAGE PICKUP APPARATUS AND METHOD OF MANUFACTURING THE SAME

CROSS-REFERENCE TO RELATED APPLICATION

The present application claims priority from Japanese Patent Application No. JP 2009-053082 filed in the Japanese Patent Office on Mar. 6, 2009, the entire content of which is incorporated herein by reference.

BACKGROUND OF THE INVENTION

1. Field of the Invention

The present invention relates to a solid-stage image pickup apparatus and a method of manufacturing the same.

2. Description of the Related Art

FIGS. 37A to 37E are schematic diagrams each showing a manufacturing method and a structure of a CIS element of a back-surface irradiation type in related art.

As shown in FIG. 37A, an SOI substrate 160 has a single crystalline silicon layer 163 through a silicon oxide layer 162 (BOX layer) formed on a base substrate 161 in consideration of a photoelectric conversion efficiency with respect to a visible light region. The single crystalline silicon layer 163 has a thickness of several μm.

Next, as shown in FIG. 37B, in the single crystalline silicon layer 163, an alignment mark 174 for a back-surface lithography process is formed. Then, in the single crystalline silicon layer 163, a photoelectric converter 171, a transfer gate 173, and a peripheral circuit portion (not shown) are formed.

Next, on the single crystalline silicon layer 163, a wiring layer 181 is formed. The wiring layer 181 is constituted of a wiring 182, an electrode pad 182P, and an interlayer insulating film 183 that covers the wiring 182 and the electrode pad 182P. Then, a surface of the interlayer insulating film 183 is flattened.

Subsequently, as shown in FIG. 37C, a support substrate 164 is bonded onto the wiring layer 181. As the support substrate 164, a silicon substrate is used, or a glass substrate or a resin substrate may be used.

Subsequently, as shown in FIG. 37D, the base substrate 161 (indicated by a dashed-two-dotted line) of the SOI substrate 160 is thinned by a mechanical polishing process. Then, by performing etching, the residual base substrate 161 is removed, and the silicon oxide layer 162 (indicated by a dashed line) that forms the SOI substrate 160 is removed.

Subsequently, as shown in FIG. 37E, on the wiring layer 181, an opening portion 165 is formed from the side of the single crystalline silicon layer 163. The opening portion 165 causes the electrode pad 182P for taking out an electrode to be exposed to outside on a bottom portion thereof. In addition, a color filter 191 is formed on the single crystalline silicon layer 163 on an optical path for light that enters the photoelectric converter 171. Further, on the color filter 191, a micro lens 192 is formed. The micro lens 192 guides the incident light to the photoelectric converter 171. In this way, a solid-state image pickup apparatus 100 of the CMOS image sensor of a back-surface irradiation type is formed.

In the solid-state image pickup apparatus 100, the incident light is not reflected by the wiring layer 181. Therefore, a high sensitivity can be obtained as compared to a CMOS image sensor of a front-surface irradiation type. However, the photoelectric converter 171 has the same area as the CMOS image sensor of the front-surface irradiation type, and therefore provides the same saturation charge amount as the CMOS image sensor of the front-surface irradiation type. Accordingly, along with a reduction in pixel size, that is, along with a reduction in the area of the photoelectric converter 171, it becomes difficult to obtain a sufficient saturation charge amount. Further, due to the reduction in the pixel size, an area of an amplifier transistor is forced to be reduced, which causes a problem of increasing a noise.

To overcome the above-mentioned problem, there has been proposed a structure in which a photoelectric converter is formed not on an SOI surface but in a substrate by utilizing a feature of a CMOS image sensor of a back-surface irradiation type.

For example, as shown in FIG. 38, a pixel structure in which a photodiode PD (photoelectric converter) is formed in a silicon layer 211 has been disclosed. The formation of the photodiode PD in the silicon layer 211 prevents interference between the photodiode PD and a pixel transistor such as an amplifier transistor AMP in terms of a layout. Therefore, a size of the photodiode PD can be maximized in a pixel size. In addition, a size of the amplifier transistor AMP can also be increased to such an extent that the photodiode PD can be removed from the surface of the silicon layer 211 (see, for example, Japanese Patent Application Laid-open No. 2008-172580).

However, in order to suppress an electrical interference between the photodiode PD and the amplifier transistor AMP, a P-N junction is formed by ion implantation in the photodiode PD to a depth of about 1 μm. The ion implantation to a deep position as in this case causes a peak of a concentration to be broad. Accordingly, it is difficult to form a junction having a steep concentration profile. The saturation charge amount of the photodiode PD is proportional to the steepness of the concentration profile of the P-N junction. Therefore, the photodiode PD formed at a deep position is relatively small in the saturation charge amount in a unit area as compared to a photodiode formed on a surface of the silicon layer 211. Accordingly, an effect of forming the photodiode PD in the silicon layer 211 is not so great in the viewpoint of the saturation charge amount.

SUMMARY OF THE INVENTION

There is a problem in that the P-N junction having the steep concentration profile is difficult to be formed, because the P-N junction of the photoelectric converter (photodiode) is formed in the silicon substrate to the depth of about 1 μm by the ion implantation.

In view of the above-mentioned circumstances, it is desirable to enable the increase of a saturation charge amount and the reduction of a noise at the same time by maximizing an area of a photoelectric converter (photodiode) and an area of an amplifier transistor and forming a P-N junction of a photoelectric converter that has a steep concentration profile.

According to an embodiment of the present invention, there is provided a solid-state image pickup apparatus including a semiconductor substrate, a photoelectric converter, a transfer gate, an insulating layer, a silicon layer, and a pixel transistor portion. The photoelectric converter converts light energy of incident light into electrical energy and obtains a signal charge. The photoelectric converter is formed on a surface side in the semiconductor substrate. The transfer gate reads the signal charge from the photoelectric converter, and is formed on the semiconductor substrate adjacent to the photoelectric converter. The insulating layer is formed on the photoelectric converter in the semiconductor substrate. The silicon layer is formed on the insulating layer. The pixel transistor portion amplifies and outputs the signal charge read by the transfer gate. The pixel transistor portion is formed on the insulating layer with the silicon layer being an active region.

In the solid-state image pickup apparatus according to the embodiment of the present invention, the photoelectric converter is formed on the surface side in the semiconductor substrate. Therefore, it is possible to form a P-N junction having a steep concentration profile. In addition, the insulating layer is formed on the photoelectric converter, and the pixel transistor portion is formed on the insulating layer. Therefore, it is possible to maximize the sizes of the photoelectric converter and the pixel transistor. For example, an amplifier transistor of the pixel transistor can be formed to have almost the same size as the photoelectric converter. Thus, the increase in saturation charge amount and the reduction in noise can be realized at the same time.

According to another embodiment of the present invention, there is provided a method of manufacturing a solid-state image pickup apparatus including forming, by using a substrate obtained by forming a silicon layer on a semiconductor substrate through an insulating layer, a photoelectric converter and an element separation region that separates the photoelectric converter, the photoelectric converter being formed in the semiconductor substrate and on a side of the insulating layer, the element separation region being formed in the semiconductor substrate, forming an active region of a pixel transistor portion on the insulating layer with the silicon layer, removing the silicon layer and the insulating layer above a formation region of a floating diffusion portion and a transfer gate adjacent to the photoelectric converter, to expose the semiconductor substrate, forming a gate insulating film on a surface of the active region formed of the silicon layer and on a surface of the semiconductor substrate exposed, forming a transfer gate electrode of the transfer gate on the exposed semiconductor substrate through the gate insulating film, and forming a gate electrode of a pixel transistor of the pixel transistor portion on the active region through the gate insulating film, and forming the floating diffusion portion on the semiconductor substrate on a side opposite to the photoelectric converter of the transfer gate electrode, and forming source/drain regions in the active region of the pixel transistor.

In the method of manufacturing a solid-state image pickup apparatus according to the embodiment of the present invention, the photoelectric converter is formed on the surface side in the semiconductor substrate. Therefore, it is possible to form a P-N junction having a steep concentration profile. In addition, the insulating layer is formed on the photoelectric converter, and the pixel transistor portion is formed on the insulating layer. Therefore, it is possible to maximize the sizes of the photoelectric converter and the pixel transistor. For example, an amplifier transistor of the pixel transistor can be formed to have almost the same size as the photoelectric converter. Thus, the increase in saturation charge amount and the reduction in noise can be realized at the same time.

The solid-state image pickup apparatus according to the embodiment of the present invention can realize the increase in saturation charge amount and the reduction in noise can be realized at the same time. Thus, there is an advantage in that an image having a high sensitivity and a high quality can be obtained.

The method of manufacturing a solid-state image pickup apparatus according to the embodiment of the present invention can realize the increase in saturation charge amount and the reduction in noise can be realized at the same time. Thus, there is an advantage in that a solid-state image pickup apparatus capable of obtaining an image having a high sensitivity and a high quality can be manufactured.

These and other objects, features and advantages of the present invention will become more apparent in light of the following detailed description of best mode embodiments thereof, as illustrated in the accompanying drawings.

DESCRIPTION OF PREFERRED EMBODIMENTS

Hereinafter, embodiments of the present invention will be described with reference to the drawings.

1. First Embodiment

First Example of Structure of Solid-State Image Pickup Apparatus

A description will be given on a first example of a structure of a solid-state image pickup apparatus according to a first embodiment of the present invention with reference to a cross-sectional diagram of a schematic structure of FIG. 1 and a planar layout diagram of FIG. 2. It should be noted that FIG. 1 is a diagram taken along the line A-A' of FIG. 2.

Figure 1:
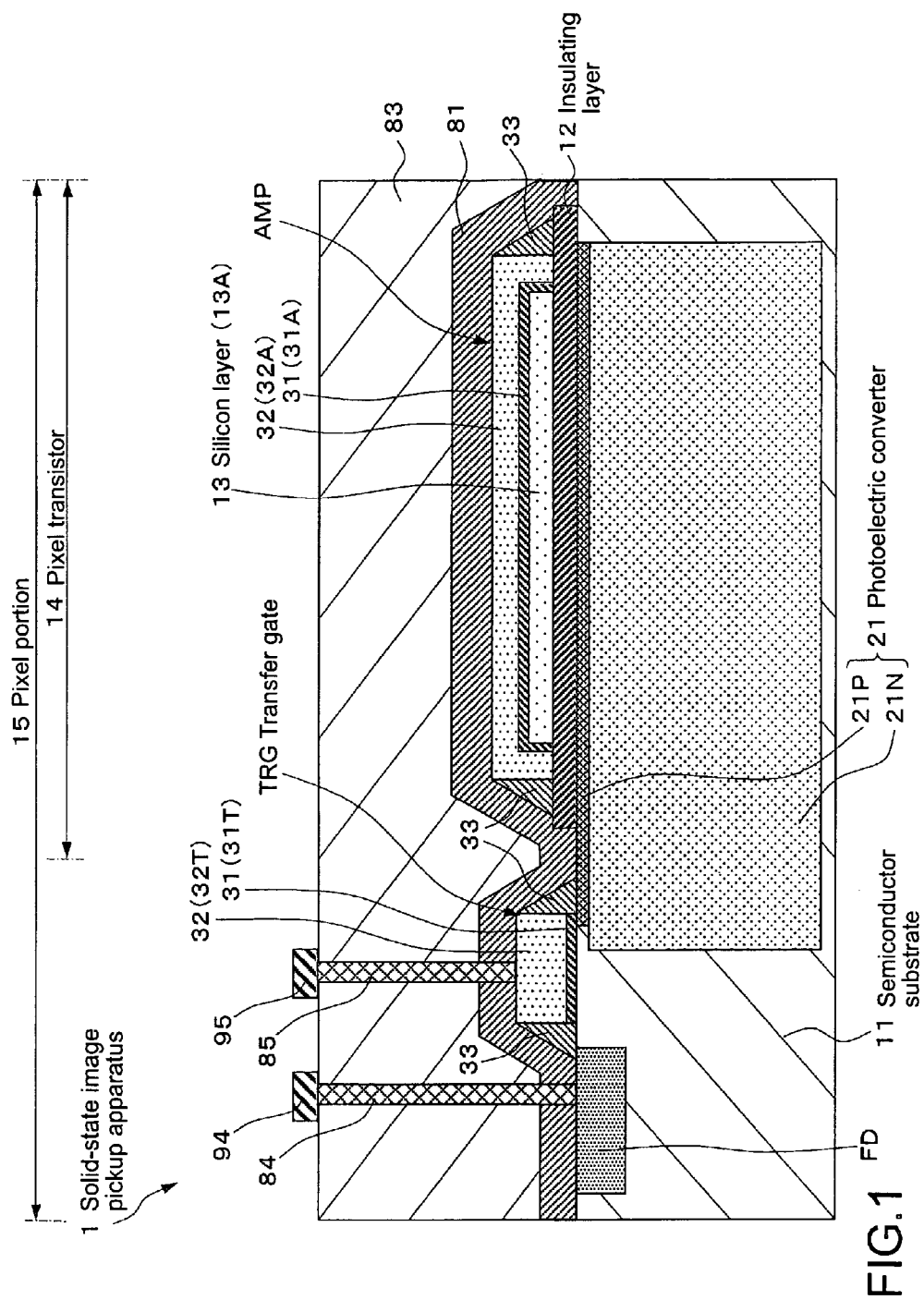
FIG. 1 is a schematic cross-sectional diagram showing a first example of a structure of a solid-state image pickup apparatus according to a first embodiment of the present invention.
Figure 2:
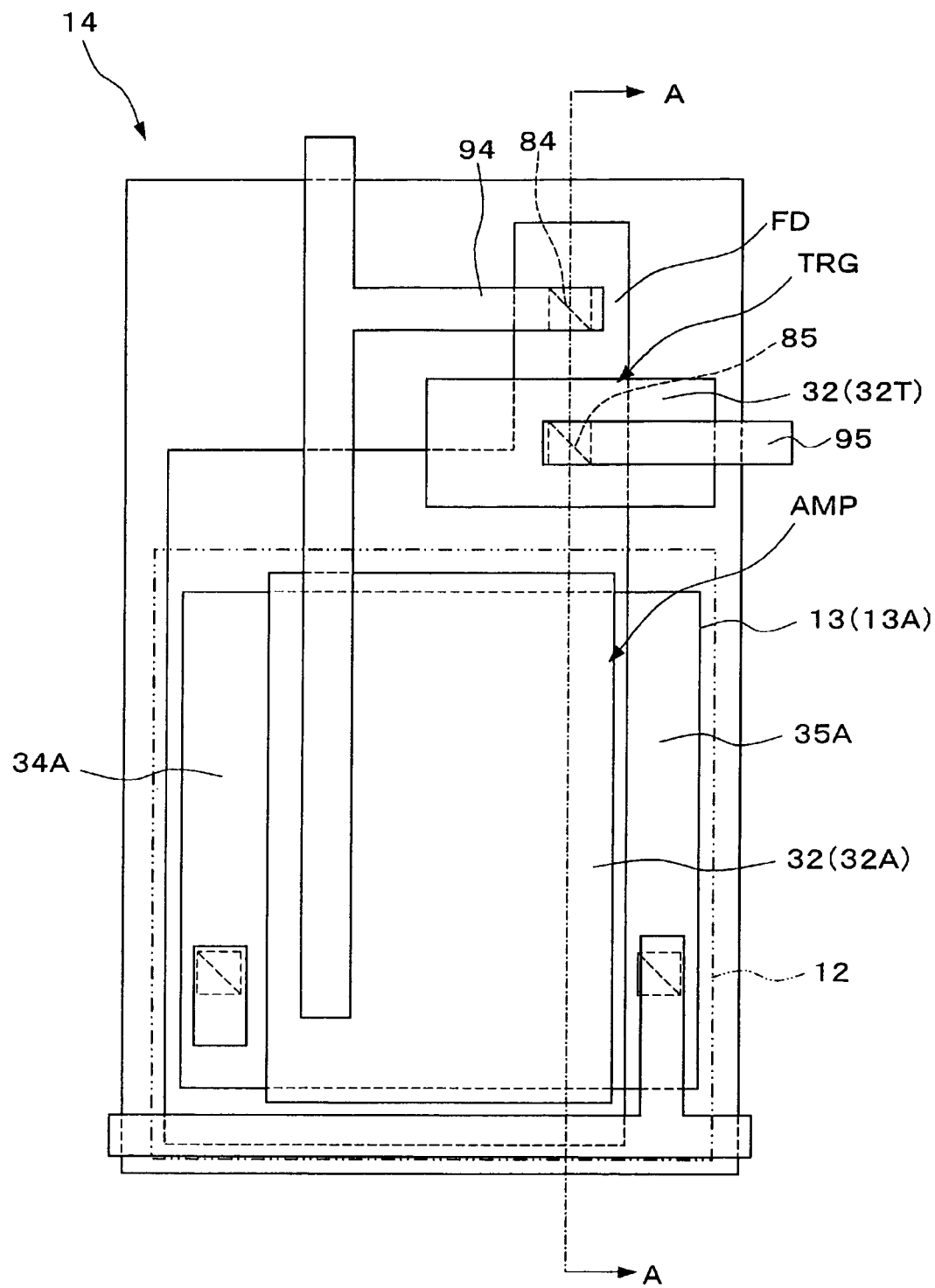
FIG. 2 is a planar layout diagram showing the first example of the solid-state image pickup apparatus.

As shown in FIGS. 1 and 2, a silicon substrate is used as a semiconductor substrate 11, for example.

On a surface side in the semiconductor substrate 11, a photoelectric converter 21 is formed. The photoelectric converter 21 performs photoelectric conversion on incident light to obtain a signal charge. The photoelectric converter 21 is formed of a photodiode constituted of an n+ diffusion layer 21N and a p+ diffusion layer 21P formed thereon.

On the semiconductor substrate 11 adjacent to the photoelectric converter 21, a transfer gate TRG is formed. The transfer gate TRG reads a signal charge from the photoelectric converter 21. The transfer gate TRG is constituted of a gate insulating film 31 (31T) formed on the semiconductor substrate 11 and a gate electrode 32 (32T) formed on the gate insulating film 31T.

On the photoelectric converter 21 in the semiconductor substrate 11, an insulating layer 12 is formed. The insulating layer 12 may partly be formed on the semiconductor substrate 11 in which the photoelectric converter 21 is not formed. For example, the insulating layer 12 may partly be formed on a formation region (not shown) of a logic circuit portion. The insulating layer 12 is formed of a silicon oxide film and has a thickness of 50 nm to 100 nm, for example.

In addition, on the insulating layer 12, a silicon layer 13 (first silicon layer 13A) is formed. The silicon layer 13 has a thickness of 50 nm to 100 nm, for example.

The silicon layer 13 may be formed to be thinner than the thickness mentioned above, as long as the silicon layer 13 has a thickness enough to form a transistor. Further, the insulating layer 12 may be thinner than the thickness mentioned above, as long as an electrical insulation property between the transistor formed on the silicon layer 13 and the photoelectric converter 21 formed on the semiconductor substrate 11 can be maintained.

Further, for the semiconductor substrate 11, the insulating layer 12, and the silicon layer 13, an SOI (silicon on insulator) substrate that uses the silicon substrate as a base substrate can be used.

On the semiconductor substrate 11, a well region (not shown) in which the photoelectric converter 21 is formed is formed. The well region separates the photoelectric converter 21 and another photoelectric converter (not shown) adjacent to the photoelectric converter 21 from each other. In addition, in the semiconductor substrate 11 on which the transfer gate TRG is formed, a well region (not shown) is also formed.

Further, although not shown, an element separation region may be formed in the semiconductor substrate 11. The element separation region separates a formation region of the photoelectric converter 21, the transfer gate TRG, and the like from a formation region of adjacent another photoelectric converter, another transfer gate, and the like. The element separation region may have an STI (shallow trench isolation) structure or may be formed of the P+ diffusion layer. Alternatively, an element separation region of a diffusion layer that is formed under the STI may be used.

On the silicon layer 13, an amplifier transistor AMP of a pixel transistor portion 14 is formed. The amplifier transistor AMP amplifies the signal charge read in the transfer gate TRG and outputs the amplified signal charge. For example, the amplifier transistor AMP has a gate electrode 32 (32A) through a gate insulating film 31 (31A) so as to stride the silicon layer 13 with the silicon layer 13 being an active region.

On sides of the gate electrode 32, sidewalls 33 are formed. The sidewalls 33 are each formed of a lamination film of a silicon oxide film having a thickness of 30 nm and a silicon nitride film having a thickness of 80 nm, for example.

Further, in the silicon layer 13 on both sides of the gate electrode 32A, source/drain regions 34A and 35A are formed.

As described above, the amplifier transistor AMP is formed of a so-called FinFET.

Generally, the pixel transistor portion 14 is constituted of a reset transistor RST, the amplifier transistor, and a selection transistor SEL. In the above example, the reset transistor RST and the selection transistor SEL are formed on a part of the silicon layer 13 (not shown) formed on the semiconductor substrate 11 in which the photoelectric converter 21 is not formed through the insulating layer 12. Alternatively, the reset transistor, the amplifier transistor, and the selection transistor may be formed in series on the silicon layer 13 formed through the insulating layer 12 above the photoelectric converter 21.

Therefore, the selection transistor SEL and the reset transistor RST (not shown) can be structured by the so-called FinFET like the amplifier transistor AMP.

Here, the reset transistor RST, the amplifier transistor AMP, and the selection transistor SEL will be described.

The reset transistor RST has a drain electrode (not shown) connected to a reset line (not shown) and a source electrode (not shown) connected to a floating diffusion portion FD. Before the transfer of the signal charge from the photoelectric converter 21 to the floating diffusion portion FD, a reset pulse is given to the gate electrode, thereby resetting a potential of the floating diffusion portion FD to a reset voltage.

The amplifier transistor AMP has the gate electrode 32A connected to the floating diffusion portion FD and the drain electrode (for example, source/drain region 34A) connected to a pixel power source Vdd. Further, the potential of the floating diffusion portion FD after the reset by the reset transistor RST is output as a reset level. In addition, the potential of the floating diffusion portion FD after the transfer of the signal charge by the transfer transistor TRG is output as a signal level.

The selection transistor SEL has a drain electrode (not shown) connected to the source electrode (source/drain region 35A) of the amplifier transistor AMP and a source electrode (not shown) connected to an output signal line (not shown), for example. When the selection pulse is given to a gate electrode (not shown), the selection transistor SEL is brought into an on state and outputs, to the output signal line (not shown), a signal output from the amplifier transistor AMP with the pixel being in a selection state.

Further, a silicide block film 81 is formed. The silicide block film 81 covers a pixel portion 15 in which the pixel transistor portion 14, the floating diffusion potion FD, and the like are formed. In addition, an etching stopper layer (not shown) and an interlayer insulating layer 83 are formed. The etching stopper layer and the interlayer insulating layer 83 cover the pixel portion 15 and the logic circuit portion (not shown). In the interlayer insulating film 83, electrodes 84 and 85 connected to the gate electrode of each of the transistors, the source/drain regions, or the like are formed, for example. In the figure, the electrodes 84 and 85 connected to the floating diffusion portion FD and the transfer gate electrode 32T, respectively, are shown as representative examples. Further, wirings 94 and 95 connected to the electrodes 84 and 85, respectively, are also formed, for example.

In addition, although not shown, on the interlayer insulating film 83, a multilayer wiring is formed in the insulating layer, and a multilayer wiring layer having an electrode that connects the wiring layers is formed. A surface of the insulating layer of the multilayer wiring layer is flattened, and a support substrate is bonded to the flattened surface.

On the other hand, a back surface side of the semiconductor substrate 11 is set to be close to the photoelectric converter 21. The back surface of the semiconductor substrate 11 is flattened.

Further, an insulating film is formed on the back surface side (side on which the removal using the CMP or the like is performed) of the semiconductor substrate 11. On the insulating film, a color filter layer, a micro lens, and the like are formed.

In this way, the solid-state image pickup apparatus 1 is structured.

In the solid-state image pickup apparatus 1, the photoelectric converter 21 is formed in the semiconductor substrate 11 on the front surface side thereof, and therefore the P-N junction having a steep concentration profile can be formed.

Generally, the photoelectric converter 21 is formed by the ion implantation. In the case of the above-described structure, it is possible to form the P-N junction having the steep concentration profile even when the ion implantation is performed on the semiconductor substrate 11 through the silicon layer 13 and the insulating layer 12 to form the photoelectric converter 21, for example. This is because the silicon layer 13 and the insulating layer 12 have the thin thickness of 100 nm in total.

In contrast, in related art, the photodiode has to be formed at a position to a depth of about 1 μm from the surface of the silicon substrate, as described above. Accordingly, it has been difficult to form the P-N junction having the steep concentration profile.

Further, the insulating layer 12 is provided on the photoelectric converter 21, and the pixel transistor portion 14 is formed on the insulating layer 12. Therefore, the sizes of the photoelectric converter 21 and the amplifier transistor AMP can be maximized. For example, the area of the amplifier transistor AMP of the pixel transistor can be set to be almost the same as that of the photoelectric converter 21. Accordingly, the increase in the saturation charge amount and the reduction in the noise can be realized at the same time.

As a result, because the solid-state image pickup apparatus 1 can realize the increase in the saturation charge amount and the reduction in the noise at the same time, there is an advantage in that an image having a high sensitivity and a high quality can be obtained.

Second Example of Structure of Solid-State Image Pickup Apparatus

Next, a second example of a structure of a solid-state image pickup apparatus of the present invention will be described with reference to a cross-sectional diagram of a schematic structure of FIG. 3 and a partial planar layout diagram of FIG. 4. In the second example, a pixel transistor portion is formed in a first silicon layer, and a transistor of a logic circuit portion is formed in a second silicon layer. That is, in the second example, the logic circuit portion is added to the structure in the first example described above.

Figure 3:
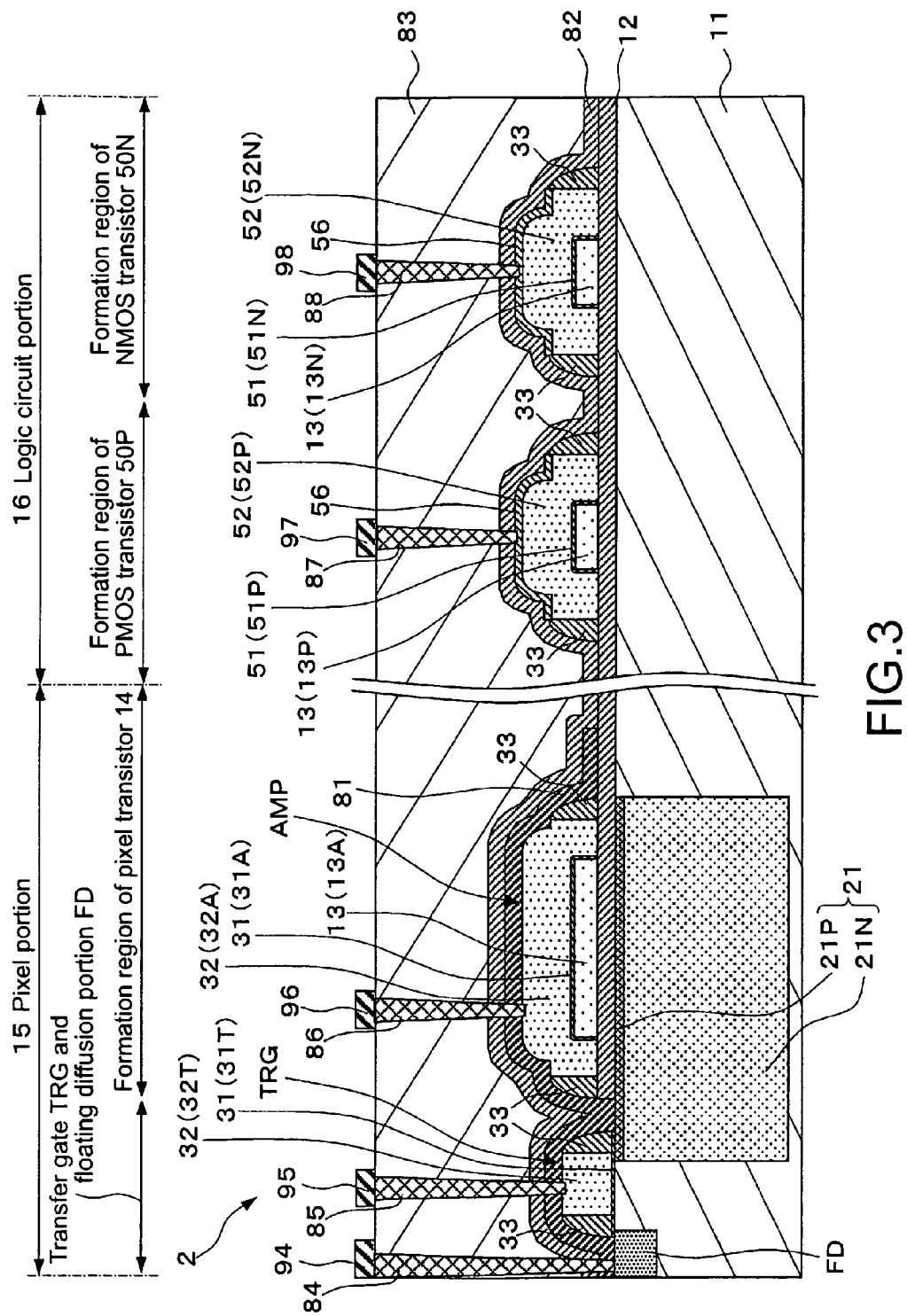
FIG. 3 is a schematic cross-sectional diagram showing a second example of a structure of a solid-state image pickup apparatus according to the first embodiment of the present invention.
Figure 4:
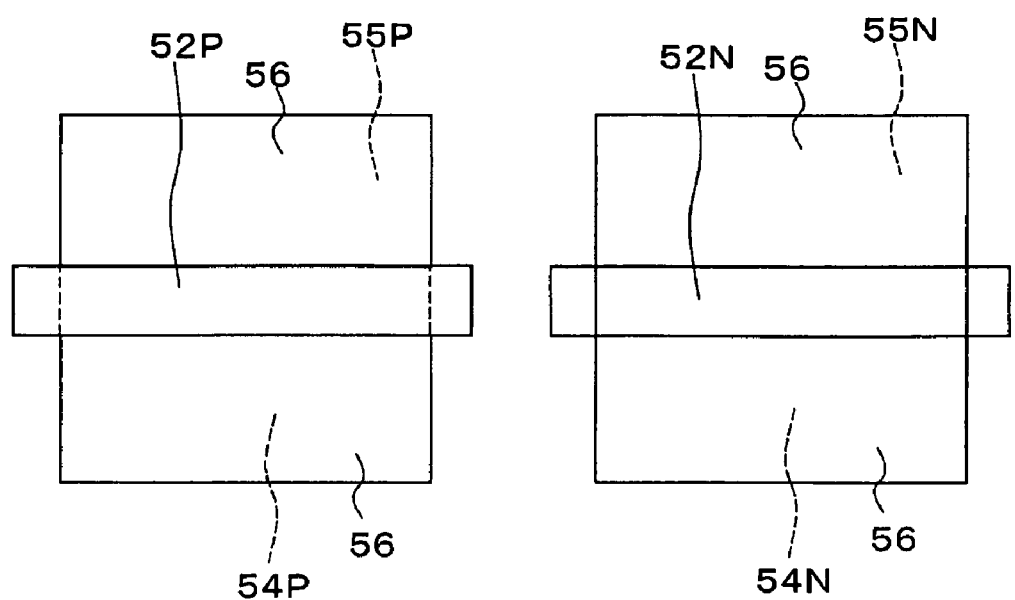
FIG. 4 is a partial planar layout diagram showing the second example of the solid-state image pickup apparatus.

As shown in FIGS. 3 and 4, as the semiconductor substrate 11, the silicon substrate is used, for example.

On the surface side in the semiconductor substrate 11, the photoelectric converter 21 is formed. The photoelectric converter 21 performs the photoelectric conversion on incident light to obtain a signal charge. The photoelectric converter 21 is formed of a photodiode constituted of the n+ diffusion layer 21N and the p+ diffusion layer 21P formed thereon.

On the semiconductor substrate 11 adjacent to the photoelectric converter 21, the transfer gate TRG is formed. The transfer gate TRG reads a signal charge from the photoelectric converter 21. The transfer gate TRG is constituted of the gate insulating film 31 (31T) formed on the semiconductor substrate 11 and the gate electrode 32 (32T) formed on the gate insulating film 31T.

On the photoelectric converter 21 in the semiconductor substrate 11, the insulating layer 12 is formed. The insulating layer 12 may partly be formed on the semiconductor substrate 11 in which the photoelectric converter 21 is not formed. The insulating layer 12 is formed of the silicon oxide film and has the thickness of 50 nm to 100 nm, for example.

In addition, on the insulating layer 12, the silicon layer 13 (first silicon layer 13A) is formed. On the silicon layer 13, a pixel transistor is formed. In addition, on the insulating layer 12 in a formation area of the logic circuit portion, silicon layers 13 (second silicon layers 13P, 13N) that are the same as the first silicon layer 13A are formed. The silicon layer 13 has a thickness of 50 nm to 100 nm, for example.

The silicon layer 13 may be formed to be thinner than the thickness mentioned above, as long as the silicon layer 13 has a thickness enough to form a transistor. Further, the insulating layer 12 may be thinner than the thickness mentioned above, as long as an electrical insulation property between a transistor formed on the silicon layer 13 and the photoelectric converter 21 formed on the semiconductor substrate 11 can be maintained.

Further, for the semiconductor substrate 11, the insulating layer 12, and the silicon layer 13, the SOI (silicon on insulator) substrate that uses the silicon substrate as a base substrate can be used.

In the semiconductor substrate 11, a well region (not shown) in which the photoelectric converter 21 is formed is formed. The well region separates the photoelectric converter 21 from another photoelectric converter (not shown) adjacent to the photoelectric converter 21. In addition, in the semiconductor substrate 11 on which the transfer gate TRG is formed, a well region (not shown) is also formed.

Further, although not shown, an element separation region may be formed in the semiconductor substrate 11. The element separation region separates the formation region of the photoelectric converter 21, the transfer gate TRG, and the like and the formation region of adjacent another photoelectric converter, another transfer gate, and the like from each other. The element separation region may have the STI (shallow trench isolation) structure or may be formed of the P+ diffusion layer. Alternatively, an element separation region of a diffusion layer that is formed under the STI may be used.

On the first silicon layer 13A, the amplifier transistor AMP of the pixel transistor portion 14 is formed. The amplifier transistor AMP amplifies the signal charge read in the transfer gate TRG and outputs the amplified signal charge. For example, the amplifier transistor AMP has the gate electrode 32 (32A) through the gate insulating film 31 (31A) so as to stride the first silicon layer 13A with the first silicon layer 13A being the active region.

On sides of the gate electrode 32, the sidewalls 33 are formed. The sidewalls 33 are each formed by using a silicon oxide film having a thickness of 30 nm and a silicon nitride film having a thickness of 80 nm, for example.

Further, on the first silicon layer 13A, on both sides of the gate electrode 32A, a source/drain region (not shown) is formed. The source/drain region is formed in the first silicon layer 13A on the front side and the rear side of the gate electrode 32T, and therefore is not shown in the figure.

As described above, the amplifier transistor AMP is formed of the so-called FinFET.

Generally, the pixel transistor portion 14 is constituted of the reset transistor RST, the amplifier transistor AMP, and the selection transistor SEL. In the above example, the reset transistor RST and the selection transistor SEL are formed on a part of the silicon layer 13 (not shown) formed on the semiconductor substrate 11 in which the photoelectric converter 21 is not formed through the insulating layer 12. Alternatively, the reset transistor RST, the amplifier transistor AMP, and the selection transistor SEL may be formed in series on the silicon layer 13 through the insulating layer 12 above the photoelectric converter 21.

Therefore, the selection transistor SEL and the reset transistor RST can be structured by the so-called FinFET like the amplifier transistor AMP.

In addition, on the second silicon layer 13P, a PMOS transistor 50P of the logic circuit portion 16 is formed, and on the second silicon layer 13N, an NMOS transistor 50N of the logic circuit portion 16 is formed.

The PMOS transistor 50P includes a gate electrode (52P) through a gate insulating film 51 (51P) so as to stride the second silicon layer 13P with the second silicon layer 13P being an active region, for example.

On both sides of the gate electrode 52P, the sidewalls 33 are formed as in the case of the gate electrode 32A.

In the second silicon layer 13P on both sides of the gate electrode 52P, source/drain regions 54P and 55P are formed.

The NMOS transistor 50N includes a gate electrode (52N) through a gate insulating film 51 (51N) so as to stride the second silicon layer 13N with the second silicon layer 13N being an active region, for example.

On both sides of the gate electrode 52N, the sidewalls 33 are formed as in the case of the gate electrode 32A.

In the second silicon layer 13N on both sides of the gate electrode 52N, source/drain regions 54N and 55N are formed.

Further, the silicide block film 81 is formed. The silicide block film 81 covers the pixel portion 15 in which the pixel transistor portion 14, the floating diffusion potion FD, and the like are formed.

On the other hand, on the source/drain regions 54P, 55P, 54N, and 55N and the gate electrode 52P and 52N of the logic circuit portion 16, a silicide layer 56 is formed. The silicide layer is formed of a cobalt silicide, for example. Alternatively, nickel silicide, platinum silicide, or the like may be used.

In addition, an etching stopper layer 82 and an interlayer insulating layer 83 are formed. The etching stopper layer 82 and the interlayer insulating layer 83 cover the pixel portion 15 and the logic circuit portion 16. In the interlayer insulating film 83, electrodes connected to the floating diffusion portion FD, the gate electrode of each of the transistors, the source/drain regions, or the like are formed, for example. In the figure, the electrodes 84 and 85 and electrodes 86, 87, and 88 connected to the floating diffusion portion FD, the transfer gate electrode 32T, the gate electrode 32A of the amplifier transistor, the gate electrode 32P of the PMOS transistor, and the gate electrode 32N of the NMOS transistor, respectively, are shown as representative examples. Further, wirings 94 and 95 connected to the electrodes 84 and 85, respectively, are also formed, for example. In addition, the wirings 94 and 95 and wirings 96, 97, and 98 connected to the electrodes 84, 85, 86, 87, and 88, respectively, are formed, for example.

In addition, although not shown, on the interlayer insulating film 83, a multilayer wiring is formed in the insulating layer, and a multilayer wiring layer having an electrode that connects the wiring layers is formed. A surface of the insulating layer of the multilayer wiring layer is flattened, and a support substrate is bonded to the flattened surface.

On the other hand, a back surface side of the semiconductor substrate 11 is set to be close to the photoelectric converter 21. The back surface of the semiconductor substrate 11 is flattened.

Further, an insulating film is formed on the back surface side (side on which the removal using the CMP or the like is performed) of the semiconductor substrate 11. On the insulating film, a color filter layer, a micro lens, and the like are formed.

In this way, a solid-state image pickup apparatus 2 is structured.

In the solid-state image pickup apparatus 2, the photoelectric converter 21 is formed in the semiconductor substrate 11 on the front surface side thereof, and therefore the P-N junction having a steep concentration profile can be formed.

Generally, the photoelectric converter 21 is formed by performing the ion implantation. In the case of the above-described structure, it is possible to form the P-N junction having the steep concentration profile even when the ion implantation is performed on the semiconductor substrate 11 through the silicon layer 13 and the insulating layer 12 to form the photoelectric converter 21, for example. This is because the silicon layer 13 and the insulating layer 12 have a thin thickness of 100 nm to 200 nm in total.

In contrast, in related art, the photodiode has to be formed at a position to a depth of about 1 μm from the surface of the silicon substrate, as described above. Accordingly, it has been difficult to form the P-N junction having the steep concentration profile.

Further, the insulating layer 12 is provided on the photoelectric converter 21, and the pixel transistor portion 14 is formed on the insulating layer 12. Therefore, the sizes of the photoelectric converter 21 and the amplifier transistor AMP can be maximized. For example, the area of the amplifier transistor AMP of the pixel transistor can be set to be almost the same as that of the photoelectric converter 21. Accordingly, the increase in the saturation charge amount and the reduction in the noise can be realized at the same time.

As a result, because the solid-state image pickup apparatus 2 can realize the increase in the saturation charge amount and the reduction in the noise at the same time, there is an advantage in that an image having a high sensitivity and a high quality can be obtained.

Comparative Example 1 of Solid-State Image Pickup Apparatus

As comparative example 1, a solid-state image pickup apparatus having a structure of related art will be described with reference to a planar layout diagram of FIG. 5 and a cross-sectional diagram of FIG. 6 which is taken along the line B-B' of FIG. 5.

Figure 5:
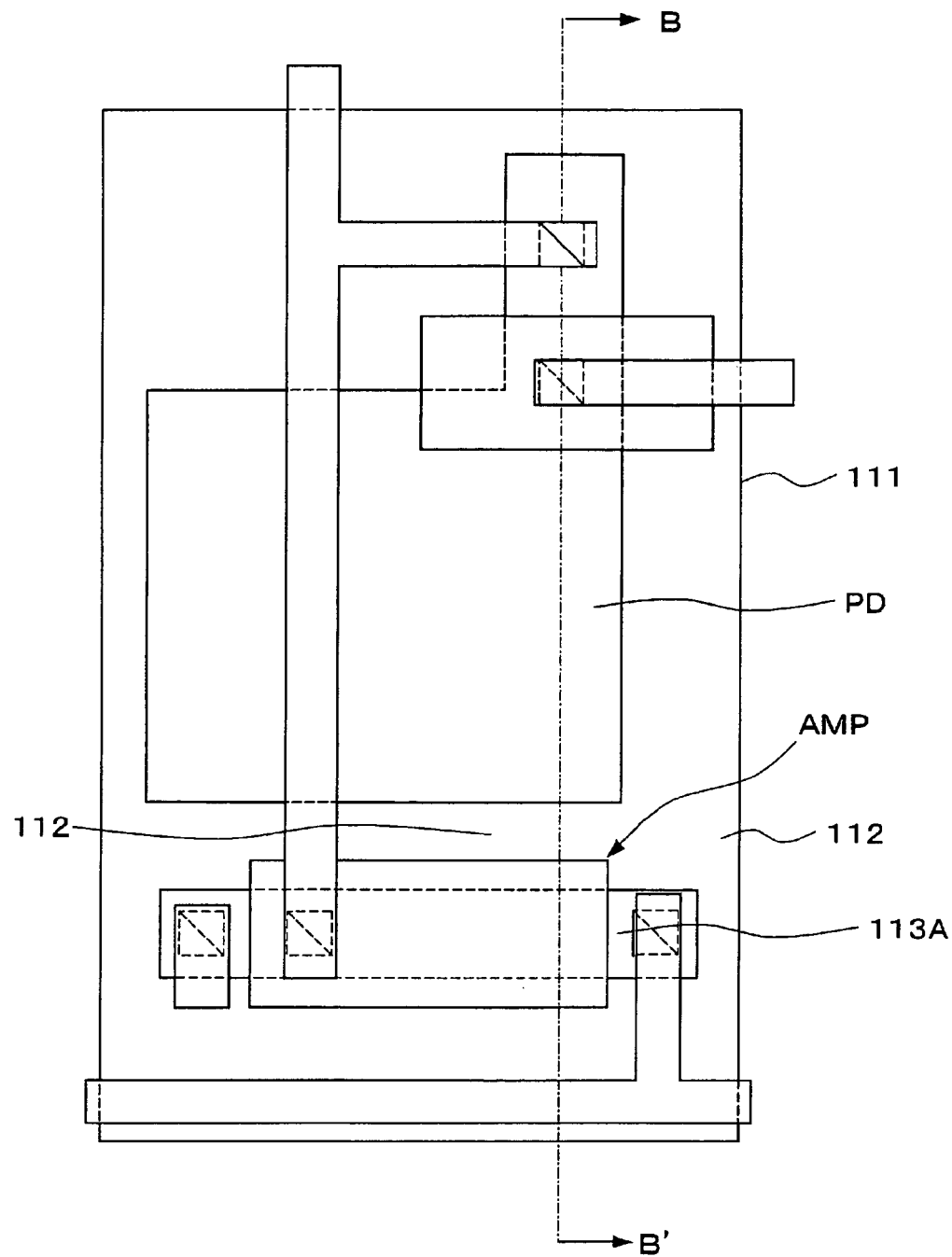
FIG. 5 is a planar layout diagram showing a comparative example 1.
Figure 6:
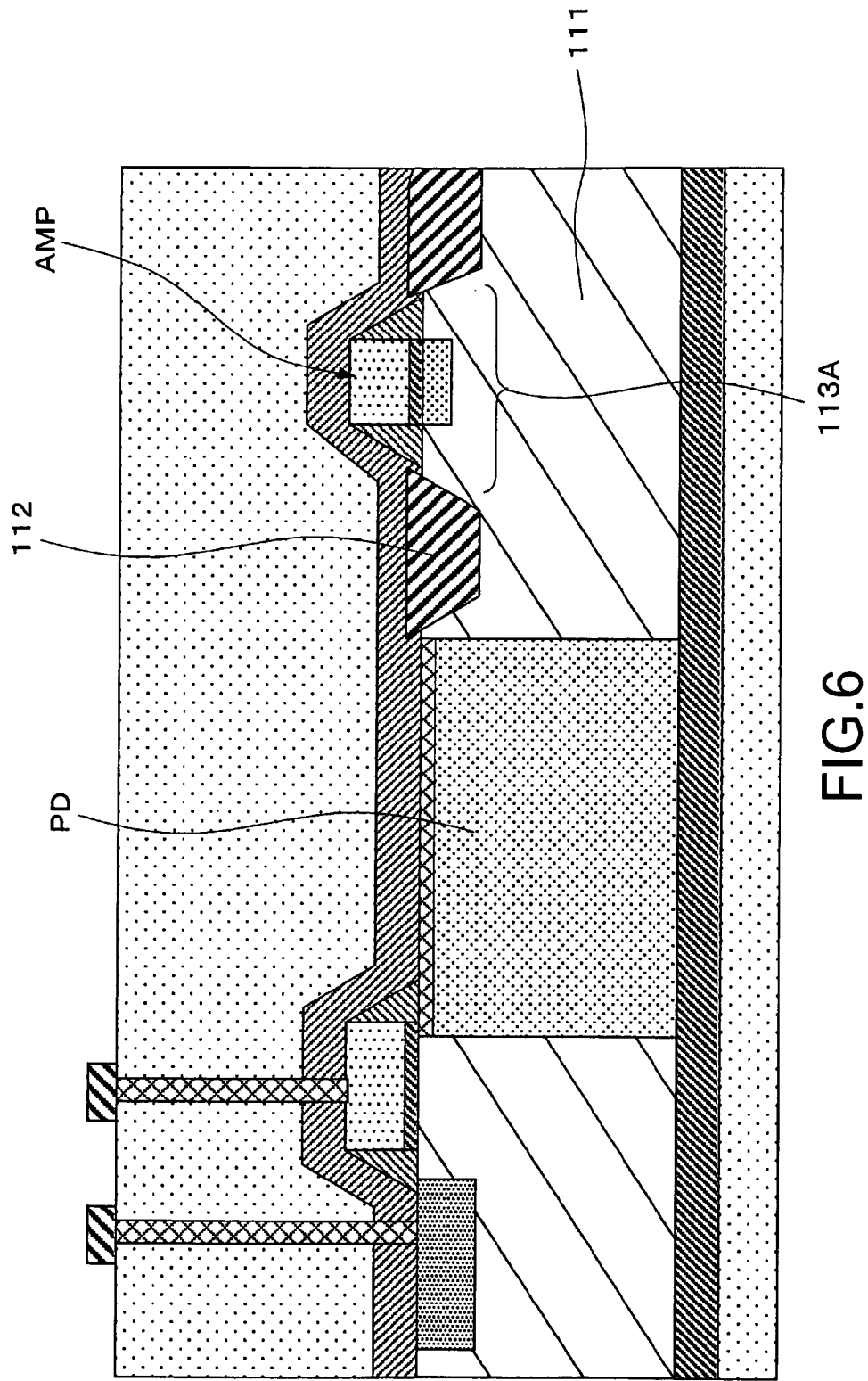
FIG. 6 is a schematic cross-sectional diagram showing a structure of the comparative example 1.

As shown in FIGS. 5 and 6, on a semiconductor layer 111, the photodiode PD and an active region 113A of the amplifier transistor AMP are formed with the photodiode PD and the active region 113A being separated by an element separation region 112. Accordingly, it is difficult to increase the size of the photodiode PD due to the presence of the active region 113A of the amplifier transistor AMP, unlike the solid-state image pickup apparatuses 1 and 2. It is also difficult to increase the size of the amplifier transistor AMP due to the presence of the photodiode PD, unlike the embodiment of the present invention.

In contrast, in the solid-state image pickup apparatuses 1 and 2, it is possible to form the photoelectric converter 21 (photodiode PD) also in the area that is occupied by the amplifier transistor AMP in related art. Accordingly, the area of the photoelectric converter 21 can be set to be large, which can increase the saturation charge amount. Therefore, the high sensitivity can be easily realized. In addition, because the amplifier transistor AMP can be extensively formed on the area that is occupied by the photodiode PD in related art, the area of the amplifier transistor AMP can be set to be large.

Therefore, unlike the comparative example 1, the solid-state image pickup apparatuses 1 and 2 can reduce the noise and obtain an image in which the noise is suppressed, which can provide a high-quality image.

Comparative Example 2 of Solid-State Image Pickup Apparatus

Next, as comparative example 2, a solid-state image pickup apparatus having a structure of related art will be described with reference to a planar layout diagram of FIG. 7 and a cross-sectional diagram of FIG. 8 which is taken along the line C-C' of FIG. 7.

Figure 7:
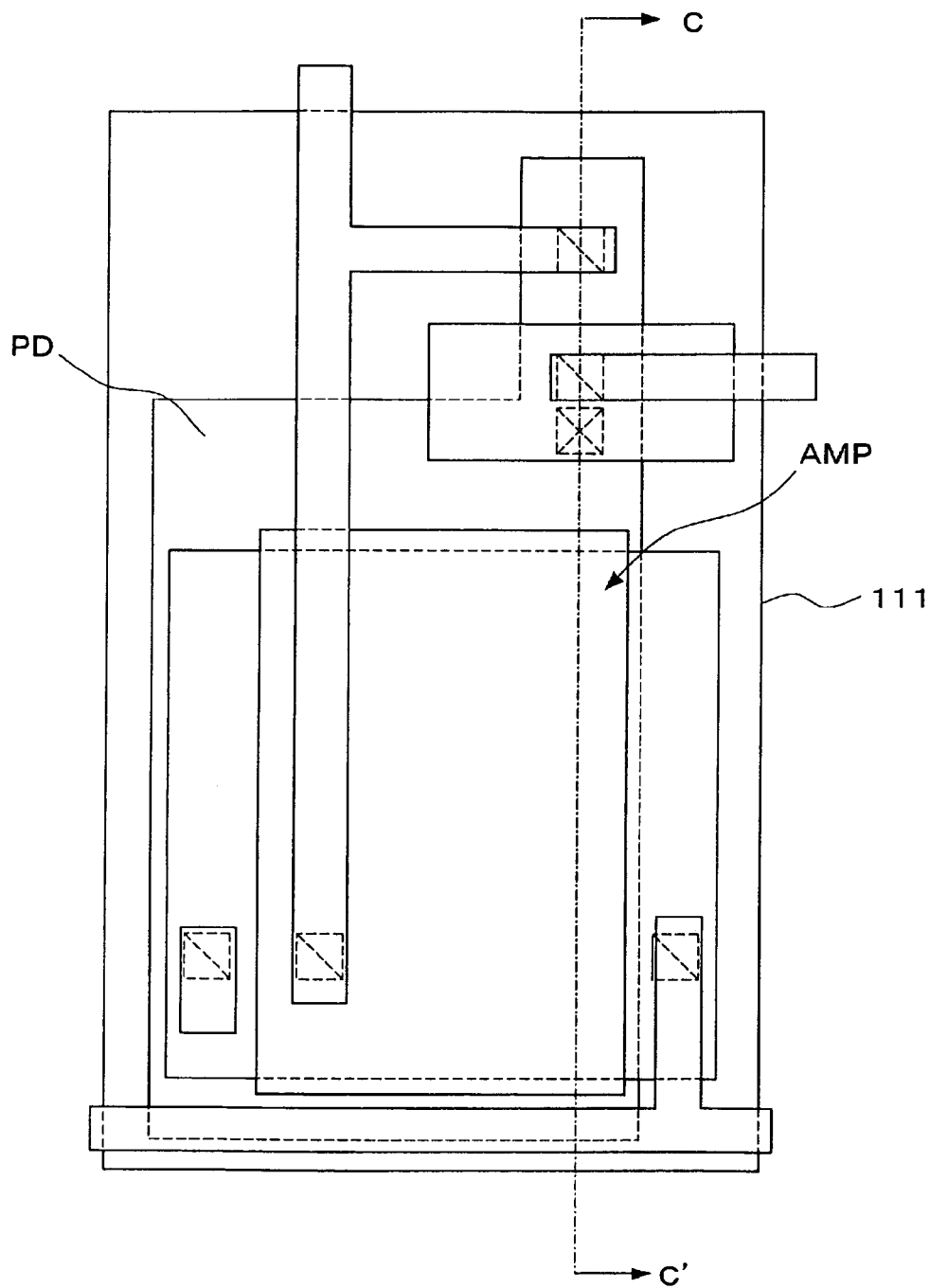
FIG. 7 is a planar layout diagram showing a comparative example 2.
Figure 8:
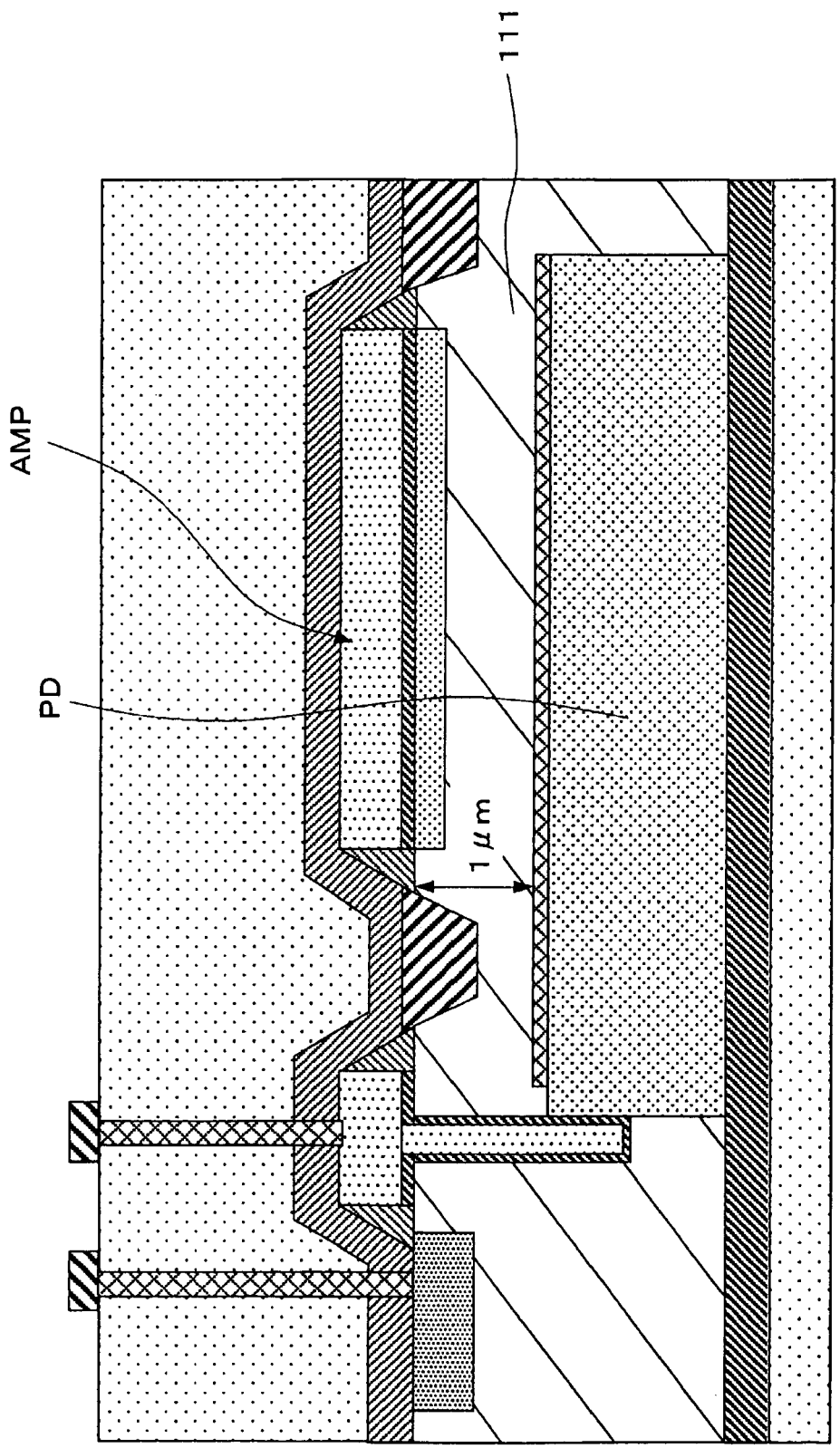
FIG. 8 is a schematic cross-sectional diagram showing a structure of the comparative example 2.

As shown in FIGS. 7 and 8, on a surface side of the semiconductor layer 111, the amplifier transistor AMP is formed. Below the amplifier transistor AMP in the semiconductor layer 111, the photodiode PD is formed. Therefore, in order to secure the electrical insulating property between the photodiode PD and the amplifier transistor AMP, it is necessary to form the photodiode PD at a deep position to about 1 μm or more from the surface of the silicon layer 111. In general, the photodiode PD is formed by performing the ion implantation. Therefore, the photodiode PD formed at the deep position is difficult to obtain the P-N junction having the steep concentration profile. As described above, the saturation charge amount of the photodiode PD is proportional to the steepness of the concentration profile of the P-N junction.

Thus, the photodiode PD formed at the deep position becomes smaller in the saturation charge amount per unit area as compared to the structure in which the photoelectric converter 21 is formed on the surface side like the solid-state image pickup apparatuses 1 and 2.

As described above, because each of the solid-state image pickup apparatuses 1 and 2 has the photoelectric converter 21 on the surface side in the semiconductor substrate 11, even if the ion implantation is performed, the P-N junction having the steep concentration profile can be obtained as compared to the comparative example 2. In addition, because the thickness of the insulating layer 12 and the silicon layer 13 formed on the semiconductor substrate 11 is 100 nm to 200 nm in total, the insulating layer 12 and the silicon layer 13 do not hinder the obtaining of the P-N junction having the steep concentration profile by the ion implantation.

2. Second Embodiment

Example of Method of Manufacturing Solid-State Image Pickup Apparatus

Next, a description will be given on an example of a method of manufacturing a solid-state image pickup apparatus according to a second embodiment of the present invention with reference to cross-sectional diagrams of manufacturing processes and partial planar layout diagrams shown in FIGS. 9 to 35.

(SOI Substrate)

Figure 9:
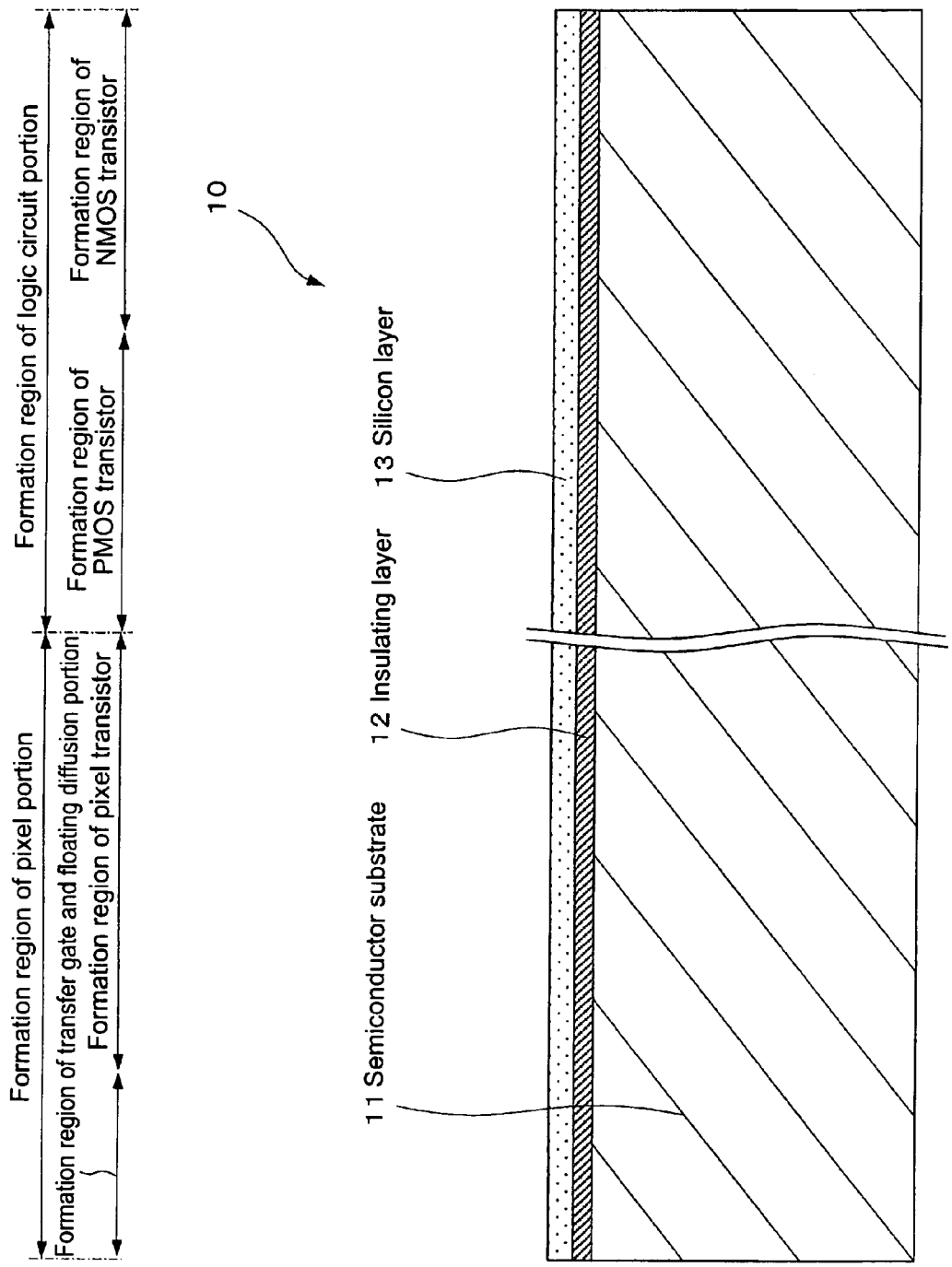
FIG. 9 is a manufacture-process cross-sectional diagram showing an example of a method of manufacturing a solid-state image pickup apparatus according to a second embodiment of the present invention.

As shown in FIG. 9, an SOI substrate 10 in which the silicon layer 13 is formed on the semiconductor substrate 11 through the insulating layer 12.

The insulating layer 12 is formed of a silicon oxide film and has a thickness of 50 nm to 100 nm, for example.

Further, the silicon layer 13 has a thickness of 50 nm to 100 nm, for example.

The silicon layer 13 only has to have a thickness enough to form a transistor thereon and may be thinner than the above-mentioned thickness. In addition, the insulating layer 12 may be thinner than the above-mentioned thickness, as long as the electrical insulating property between the transistor formed on the silicon layer 13 and the semiconductor substrate 11 is maintained.

Next, although not shown, an element separation region is formed in the semiconductor substrate. The element separation region separates an area in which the photoelectric converter is formed. The element separation region may have the STI (shallow trench isolation) structure or may be formed of the P+ diffusion layer. Alternatively, an element separation region of a diffusion layer that is formed under the STI may be used.

Further, in the semiconductor substrate 11, a well region in which the photoelectric converter is formed. The well region separates the photoelectric converter from another photoelectric converter adjacent thereto. In addition, the well region is formed also in the area in which the transfer gate of the semiconductor substrate 11 is formed.

(Formation of Photoelectric Converter)

Figure 10:
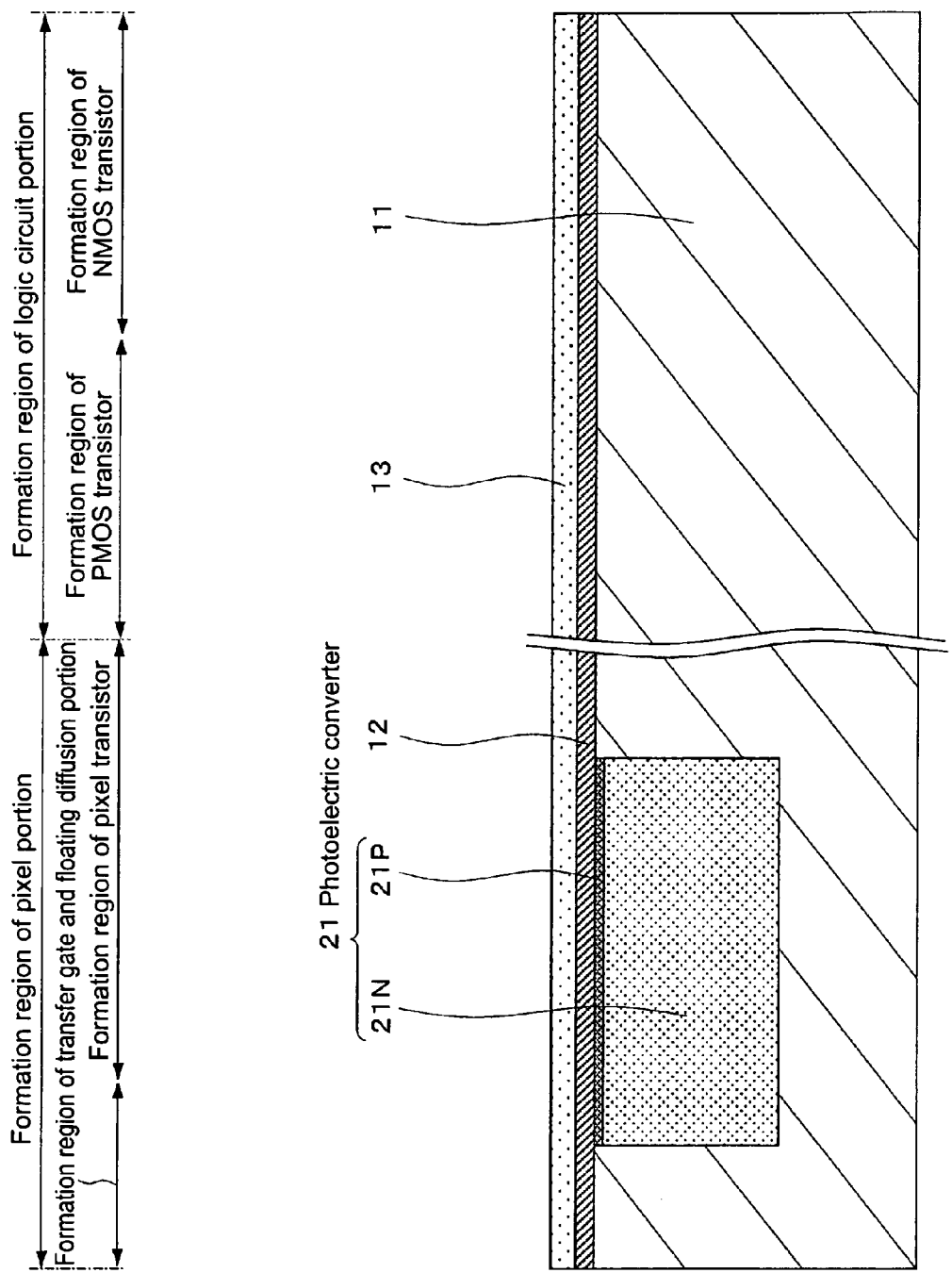
FIG. 10 is a manufacture-process cross-sectional diagram showing an example of a method of manufacturing the solid-state image pickup apparatus.

Subsequently, as shown in FIG. 10, a resist film (not shown) is formed on the silicon layer 13 by a resist coating technique, and patterning is performed on the resist film by a lithography technique, to form a resist pattern having an opening on the formation region of the photoelectric converter.

By performing the ion implantation using the resist pattern as a mask, the photoelectric converter 21 is formed in the semiconductor substrate 11 and on the side of the insulating layer 12. The photoelectric converter 21 performs the photoelectric conversion on incident light to obtain a signal charge. The photoelectric converter 21 is formed of the photodiode constituted of the n+ diffusion layer 21N and the p+ diffusion layer 21P formed thereon.

By the ion implantation, it is possible to form the n+ diffusion layer 21N and p+ diffusion layer 21P so as to have the steep concentration profile, because the thickness of the insulating layer 12 and the silicon layer 13 becomes thin in total, specifically, about 100 nm.

After that, the resist pattern is removed.

(Formation of Hard Mask Layer)

Figure 11:
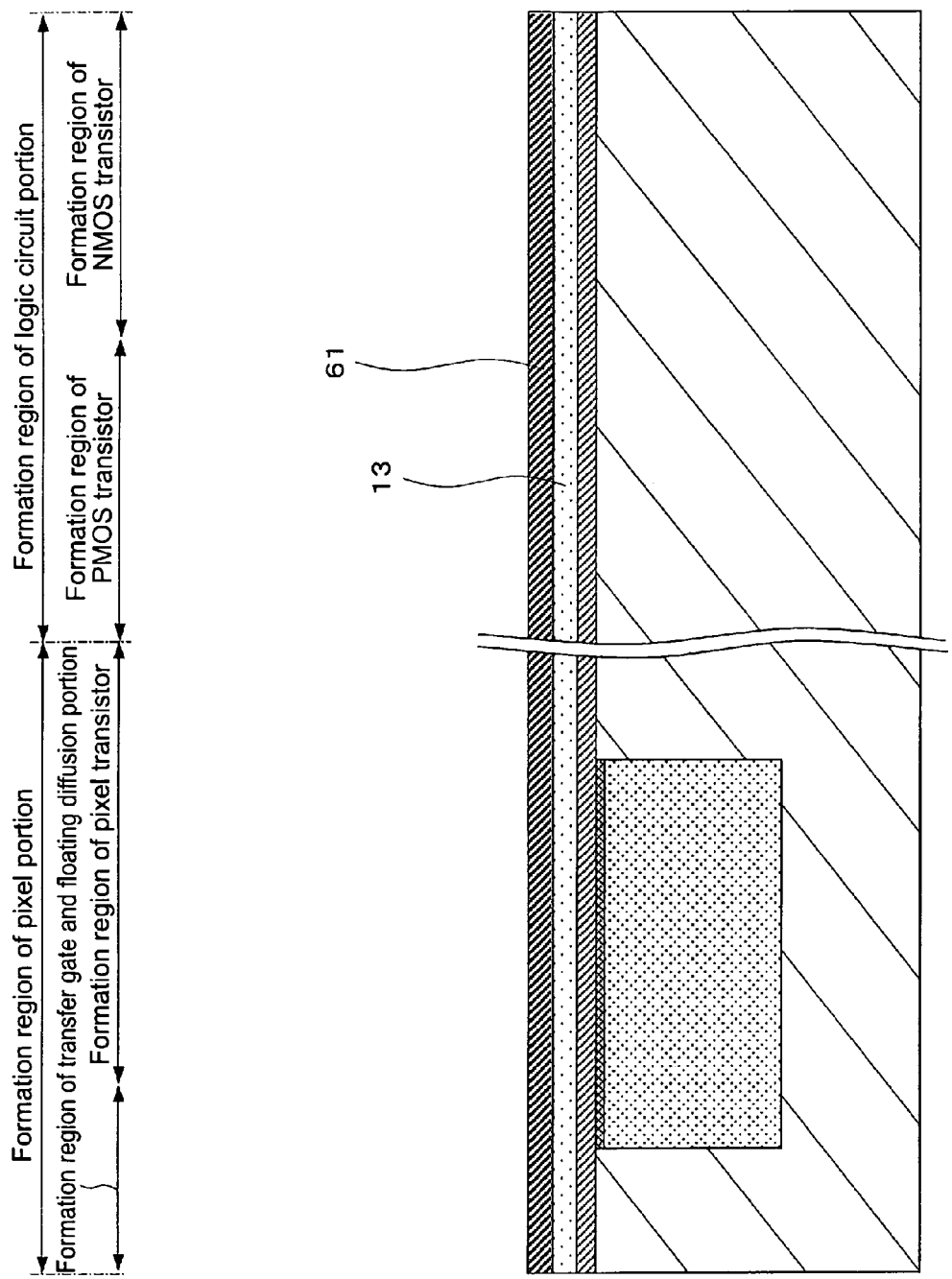
FIG. 11 is a manufacture-process cross-sectional diagram showing an example of a method of manufacturing the solid-state image pickup apparatus.

Next, as shown in FIG. 11, a hard mask layer 61 is formed on the silicon layer 13. The hard mask layer 61 is formed of a silicon nitride film by a reduced-pressure CVD method, for example. A thickness of the silicon nitride film is set to about 200 nm, for example.

(Formation of Resist Pattern)

Figure 12:
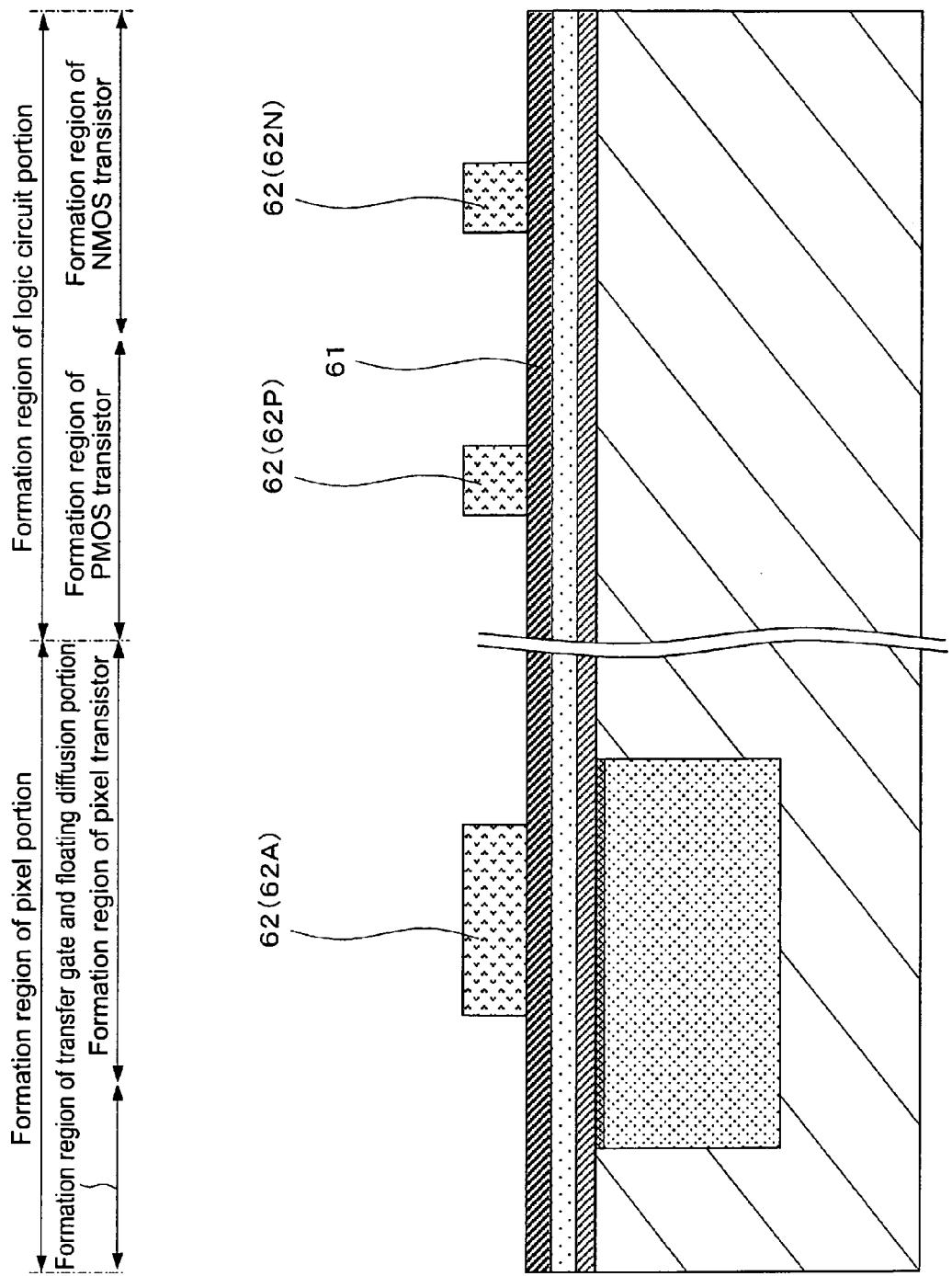
FIG. 12 is a manufacture-process cross-sectional diagram showing an example of a method of manufacturing the solid-state image pickup apparatus.

Next, as shown in FIG. 12, on the hard mask layer 61 corresponding to a formation region of the pixel transistor of the pixel transistor portion and formation regions of the PMOS transistor and the NMOS transistor of the logic circuit portion, resist patterns 62 (62A, 62P, and 62N) are formed. The resist patterns 62 each formed by patterning, by using the lithography technique, a resist film formed by a general resist coating technique.

(Patterning of Hard Mask Layer)

Figure 13:
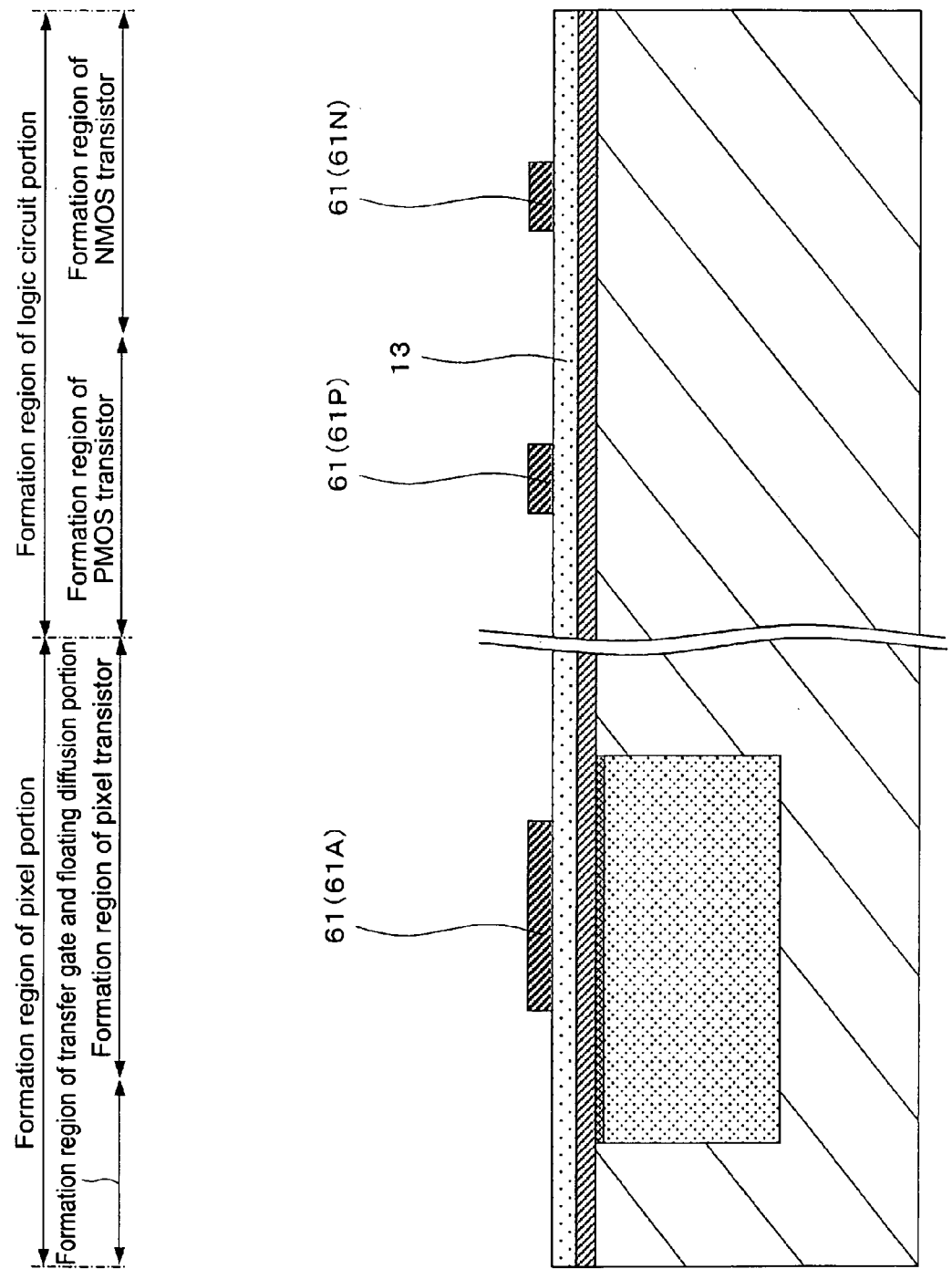
FIG. 13 is a manufacture-process cross-sectional diagram showing an example of a method of manufacturing the solid-state image pickup apparatus.

Next, as shown in FIG. 13, the hard mask layer 61 is etched by performing etching with the resist patterns 62 (see, FIG. 12) being used as an etching mask. As a result, hard mask patterns 61A, 61P, and 61N formed of the hard mask layer 61 are formed on the silicon layer 13. After that, the resist pattern 62 is removed.

It should be noted that the figure shows a state where the resist pattern 62 is removed.

(Process on Silicon Layer)

Figure 14:
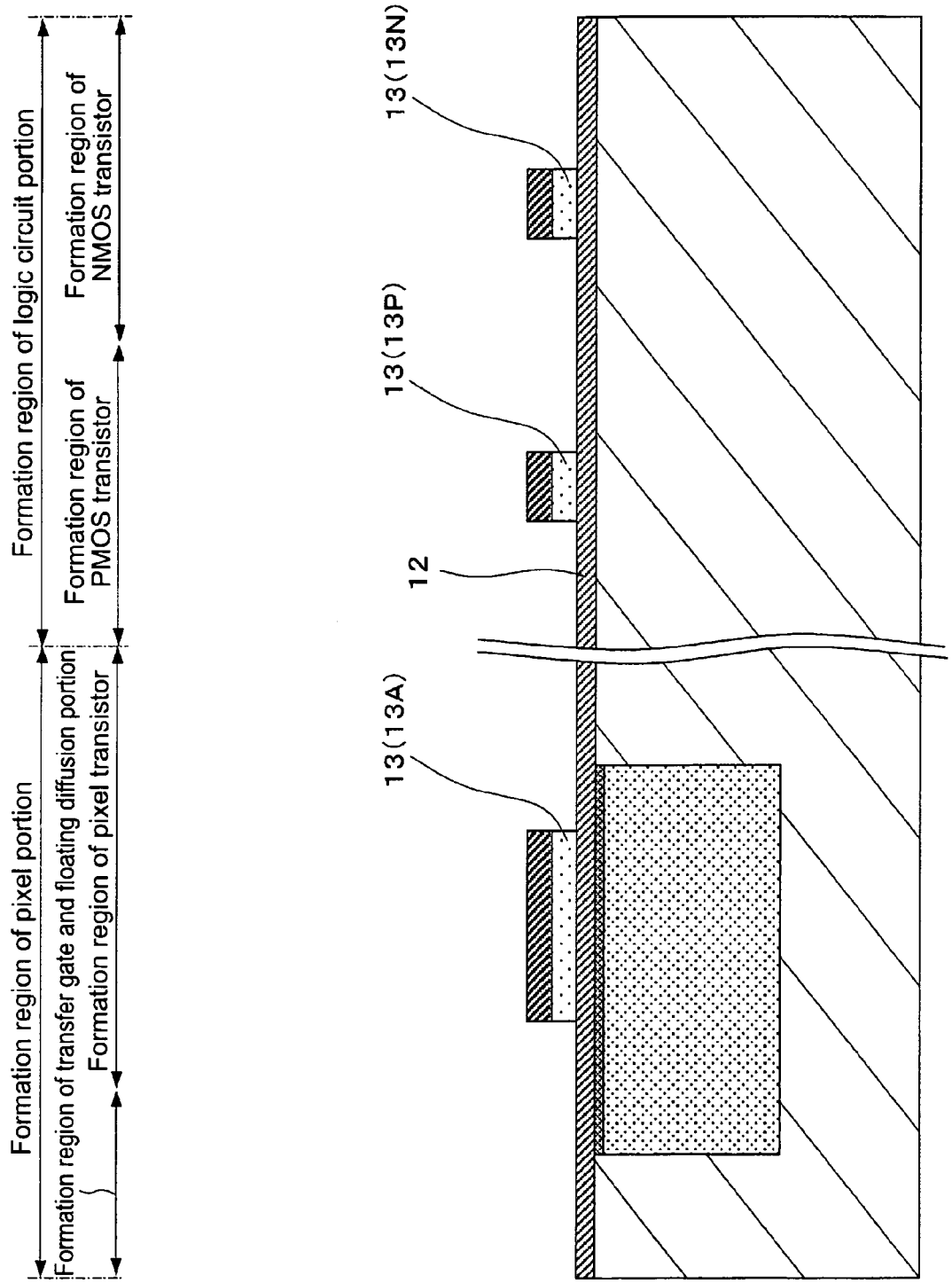
FIG. 14 is a manufacture-process cross-sectional diagram showing an example of a method of manufacturing the solid-state image pickup apparatus.

Next, as shown in FIG. 14, the silicon layer 13 is etched by using the hard mask patterns 61A, 61P, and 61N (see, FIG. 13) as an etching mask, to form the first silicon layer 13A is formed in the formation region of a pixel unit. The first silicon layer 13A serves as an active region of the pixel transistor. At the same time, the second silicon layer 13P as the active region is formed in the formation region of the PMOS transistor of the logic circuit portion, and the second silicon layer 13N as the active region is formed in the formation region of the NMOS transistor. The etching of the silicon layer 13 at this time is stopped up to the insulating layer 12.

(Formation of Resist Pattern)

Figure 15:
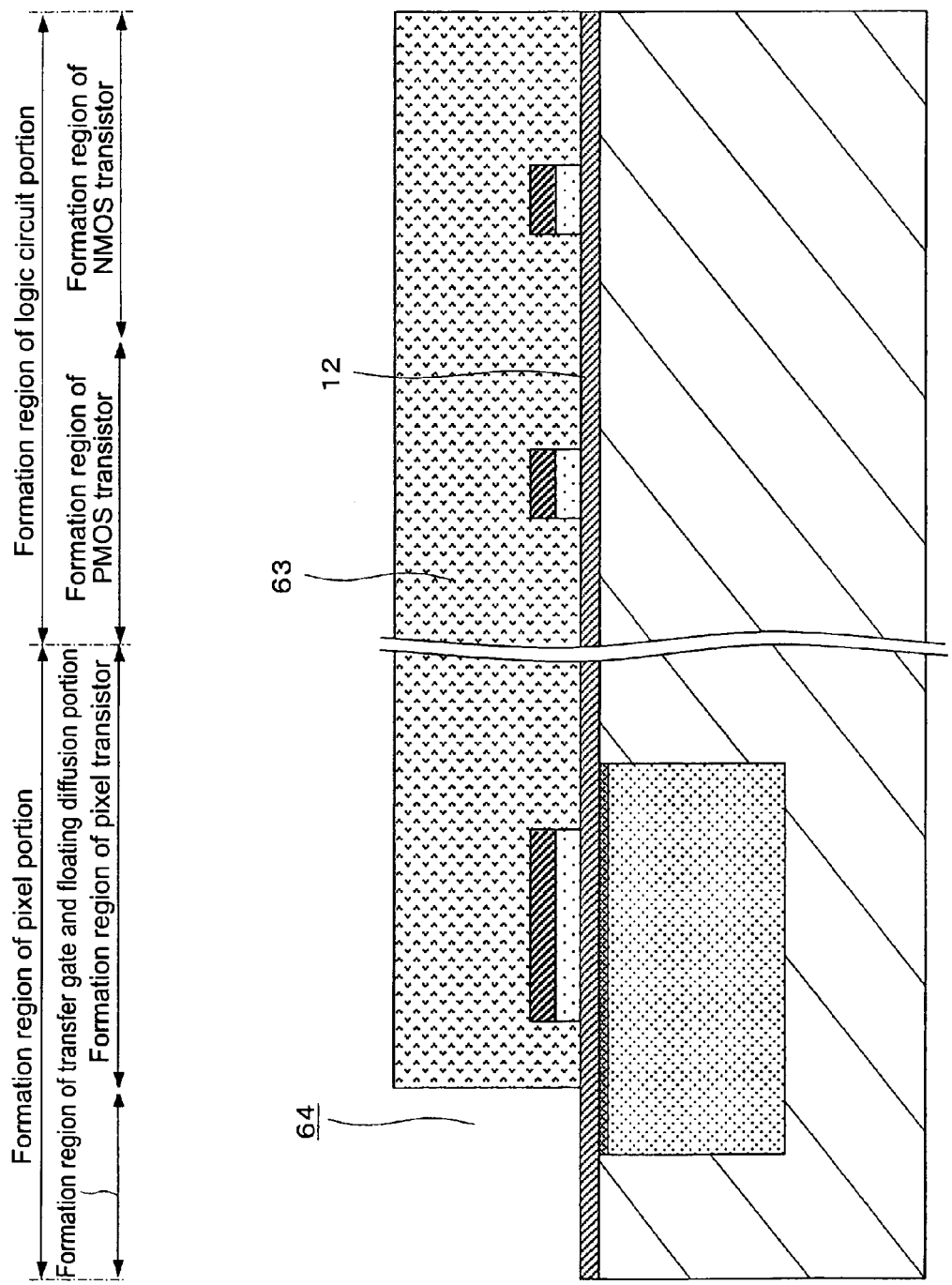
FIG. 15 is a manufacture-process cross-sectional diagram showing an example of a method of manufacturing the solid-state image pickup apparatus.

Next, as shown in FIG. 15, a resist pattern 63 is formed on the insulating layer 12 by the resist coating technique and the lithography technique. The resist pattern 63 covers the formation region of the pixel transistor and the formation region of the logic circuit portion, and has an opening portion 64 above a region in which the transfer gate and the floating diffusion portion are formed.

(Etching of Insulating Layer)

Figure 16:
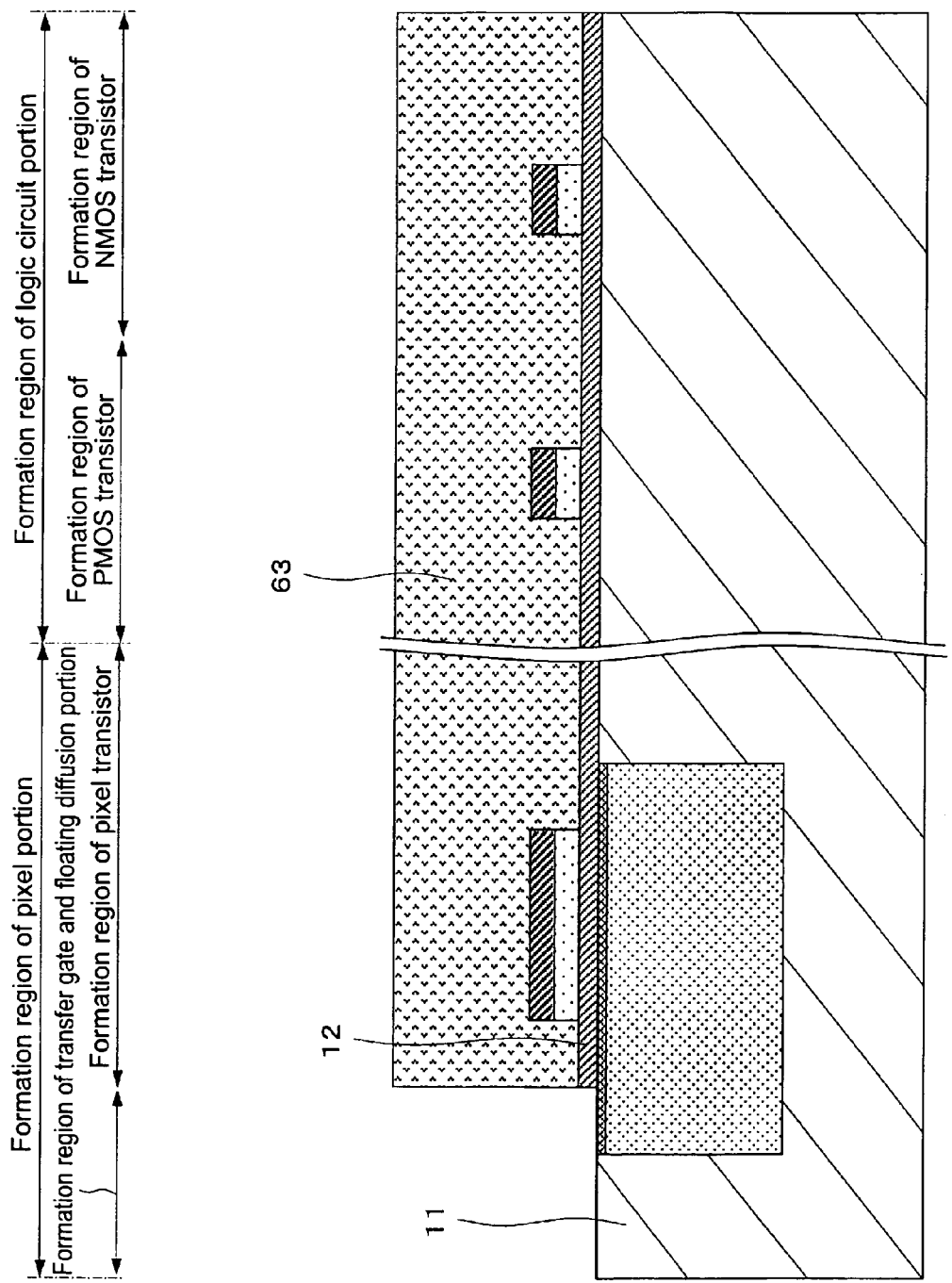
FIG. 16 is a manufacture-process cross-sectional diagram showing an example of a method of manufacturing the solid-state image pickup apparatus.

Next, as shown in FIG. 16, the insulating layer is etched by using the resist pattern 63 as an etching mask.

As a result, the insulating layer 12 on the region in which the transfer gate and the floating diffusion portion are formed is removed, thereby exposing the semiconductor substrate 11 to outside.

In the above-mentioned etching, it is desirable to perform a wet etching in order to minimize an etching damage to the semiconductor substrate 11. A dilute hydrofluoric acid (DHF) is used as an etchant, for example.

After that, the resist pattern 63 is removed.

It should be noted that the figure shows a state immediately before the resist pattern 63 is removed.

(Exposure of Semiconductor Substrate of Floating Diffusion Portion)

Figure 17:
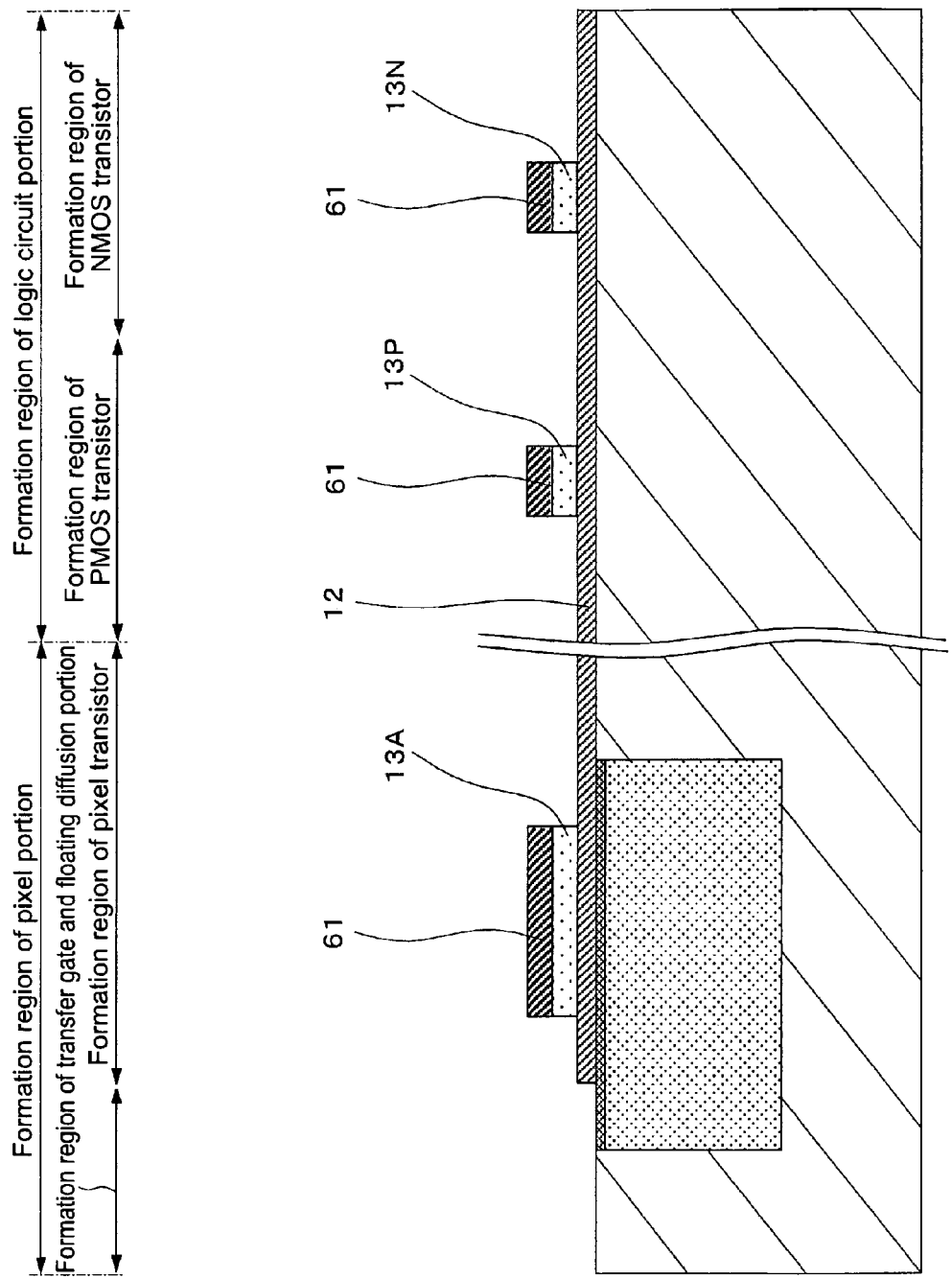
FIG. 17 is a manufacture-process cross-sectional diagram showing an example of a method of manufacturing the solid-state image pickup apparatus.

As a result, as shown in FIG. 17, the semiconductor substrate 11 corresponding to the region in which the transfer gate and the floating diffusion portion are formed is exposed to outside. Further, on the insulating layer 12, the first silicon layer 13A serving as the active region of the pixel transistor is formed in the pixel portion in an island-like shape, with the first silicon layer 13A being covered with the hard mask layer 61. At the same time, the second silicon layer 13P serving as the active region of the PMOS transistor of the logic circuit region and the second silicon layer 13N serving as the active region of the NMOS transistor are formed in the island-like shape.

After that, the hard mask layer 61 is removed. It is desirable that the removal of the hard mask layer 61 is performed by, for example, the wet etching so that an etching damage to the silicon layer 13 is prevented as much as possible. For example, a thermal phosphoric acid is used as an etchant.

It should be noted that the figure shows a state immediately before the hard mask layer 61 is removed.

(After Removal of Hard Mask Layer)

Figure 18:
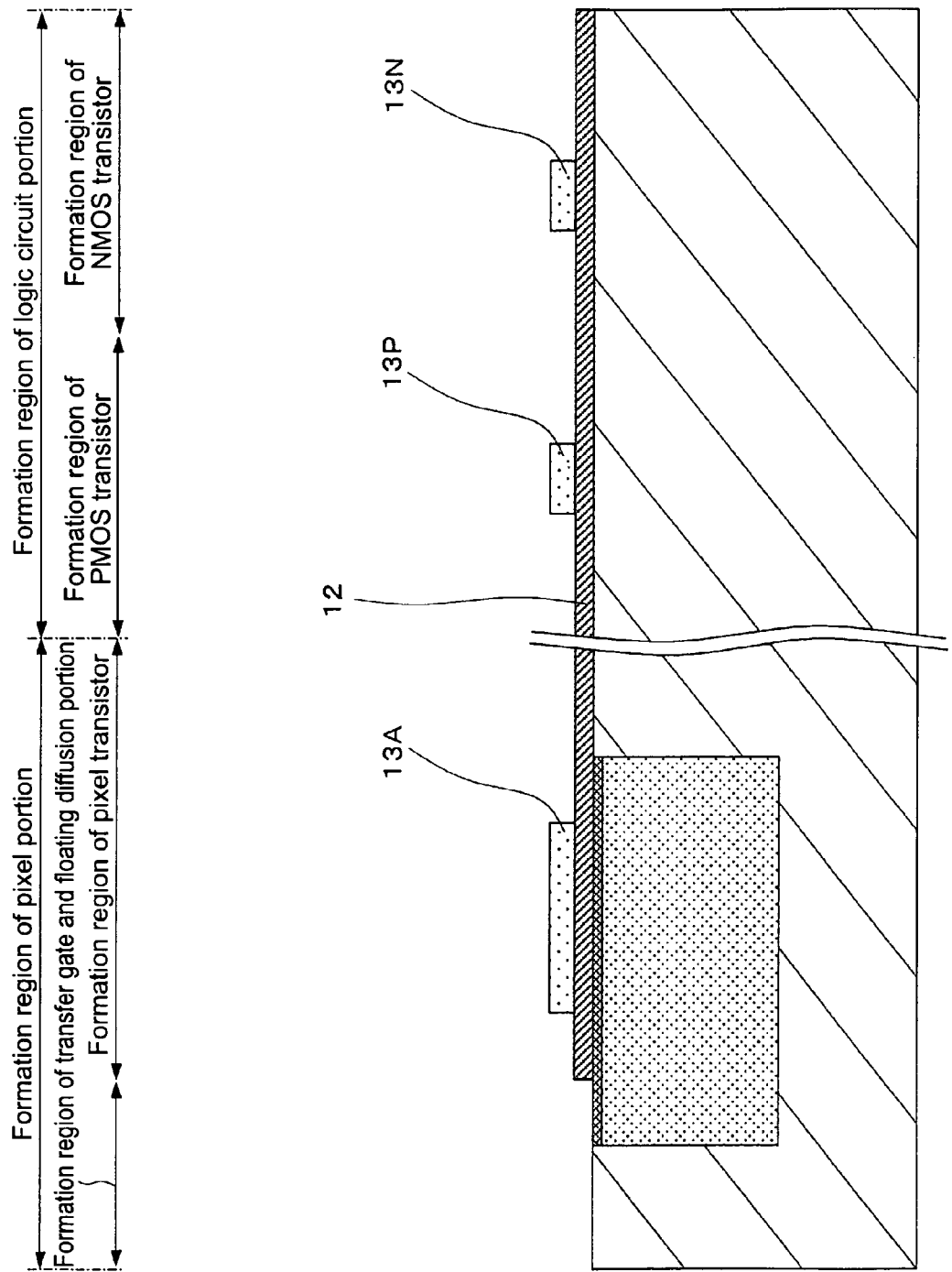
FIG. 18 is a manufacture-process cross-sectional diagram showing an example of a method of manufacturing the solid-state image pickup apparatus.

As a result, as shown in FIG. 18, in the formation region of the pixel portion on the insulating layer 12, the first silicon layer 13A serving as the active region of the pixel transistor is formed. At the same time, the second silicon layer 13P serving as the active region of the PMOS transistor and the second silicon layer 13N serving as the active region of the NMOS transistor are formed in the formation region of the logic circuit portion in the island-like shape.

(Formation of Gate Insulating Film)

Figure 19:
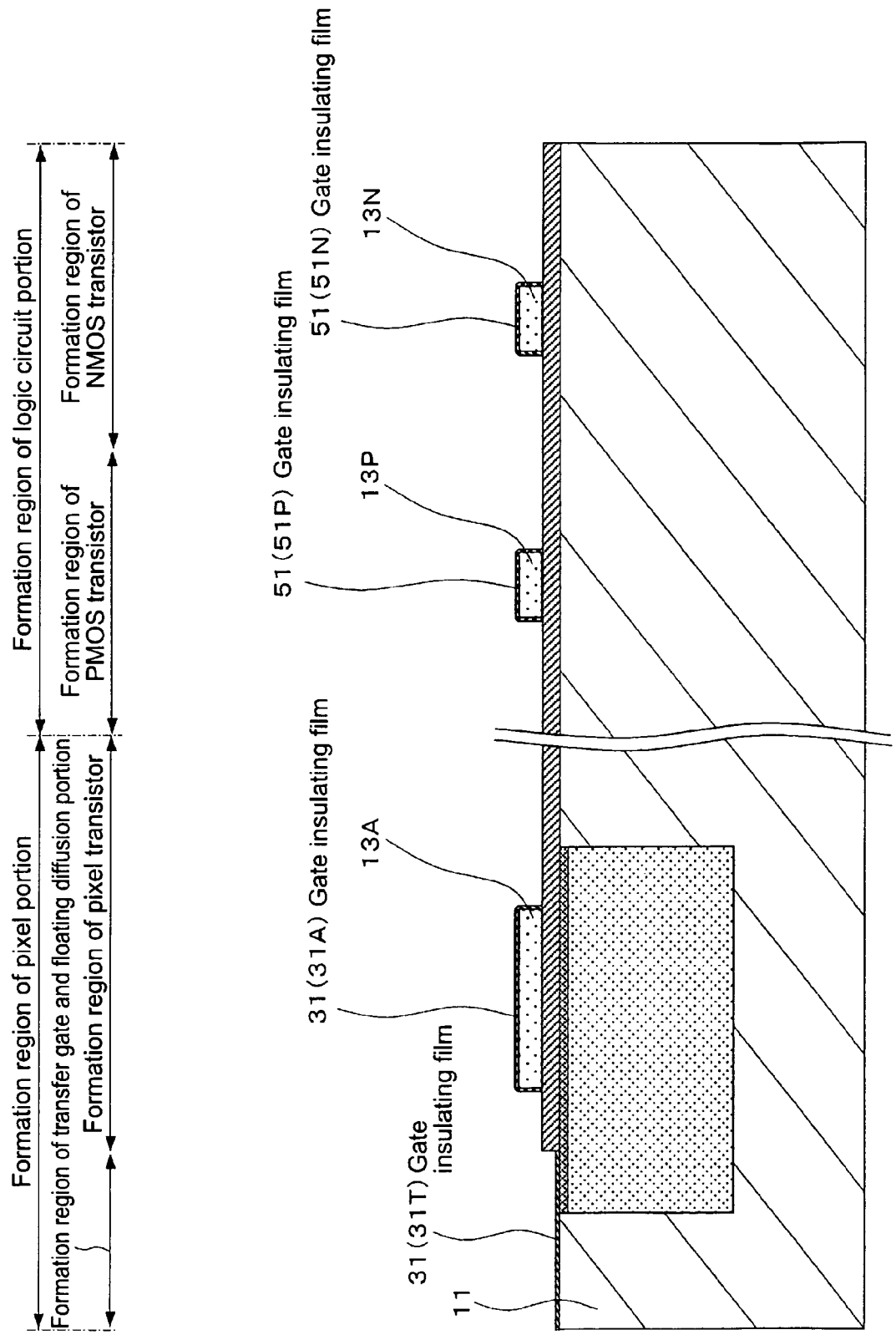
FIG. 19 is a manufacture-process cross-sectional diagram showing an example of a method of manufacturing the solid-state image pickup apparatus.

Next, as shown in FIG. 19, on the surface of the semiconductor substrate 11 and on the surface of the first silicon layer 13A, the gate insulating films 31 (31T and 31A) are formed. In addition, on each of surfaces of the second silicon layers 13P and 13N, the gate insulating films 51 (51P and 51N) are formed. The gate insulating films 31 and 51 are each formed of a silicon oxide film by a thermal oxidation method, for example.

In addition, the gate insulating films 31 and 51 may have thicknesses corresponding to the pixel transistor, the PMOS transistor, and the NMOS transistor, respectively.

(Formation of Gate Electrode Formation Film)

Figure 20:
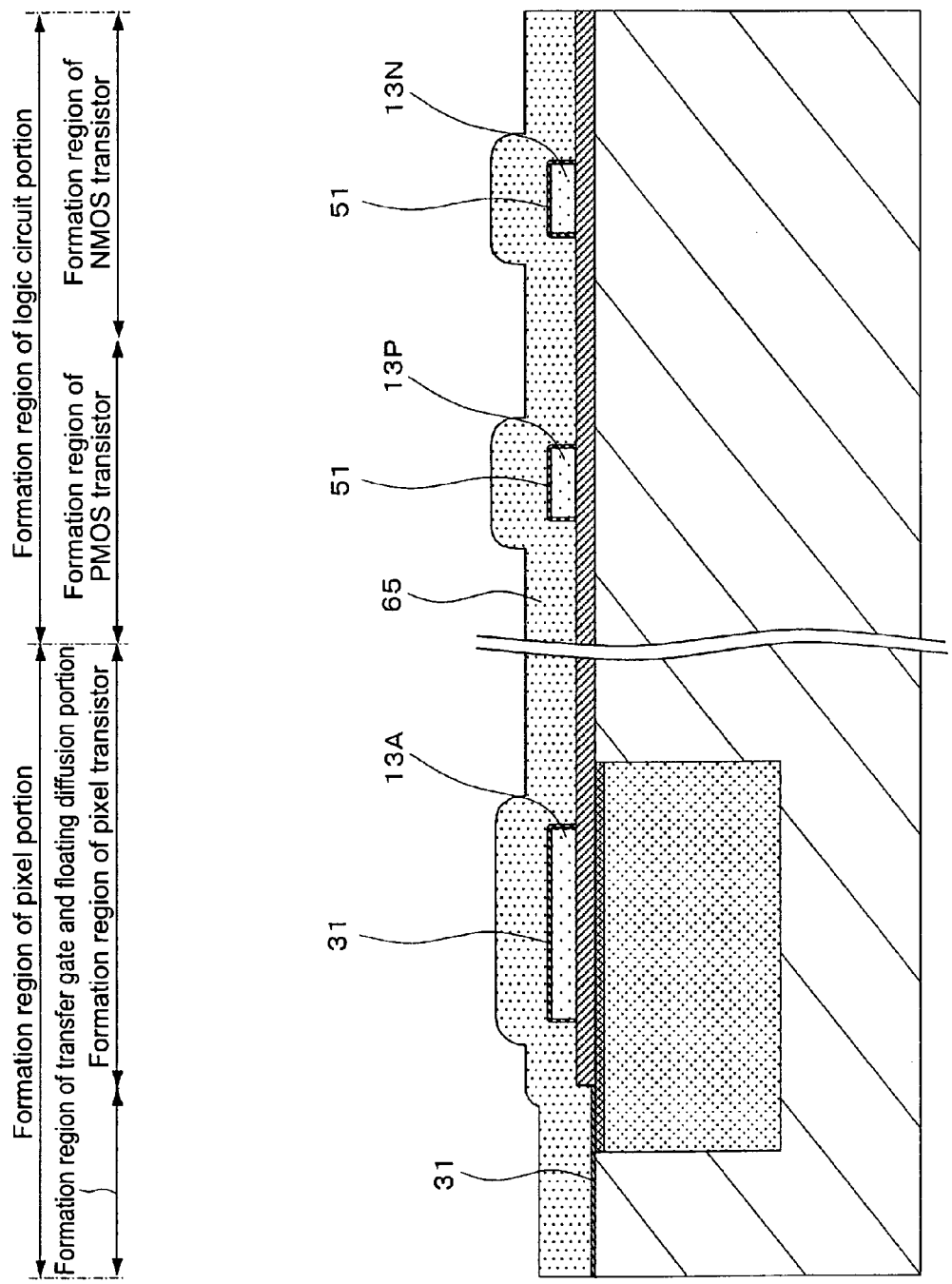
FIG. 20 is a manufacture-process cross-sectional diagram showing an example of a method of manufacturing the solid-state image pickup apparatus.

Next, as shown in FIG. 20, a gate electrode formation film 65 is formed so as to cover the first silicon layer 13A, the second silicon layers 13P and 13N, and the semiconductor substrate 11, on which the gate insulating films 31 and 51 are formed. The gate electrode formation film 65 is formed of a polysilicon film, for example.

Further, the gate electrode formation film 65 on the formation region of the transfer gate, the formation region of the pixel transistor, and the formation region of the NMOS transistor of the logic circuit portion is subjected to the ion implantation of phosphorus as an N-type impurity, for example. In addition, the gate electrode formation film 65 on the formation region of the PMOS transistor of the logic circuit portion is subjected to the ion implantation of boron as a P-type impurity region, for example.

For the ion implantations, a resist mask is used.

After the ion implantation, the resist mask is removed.

(Formation of Resist Pattern)

Figure 21:
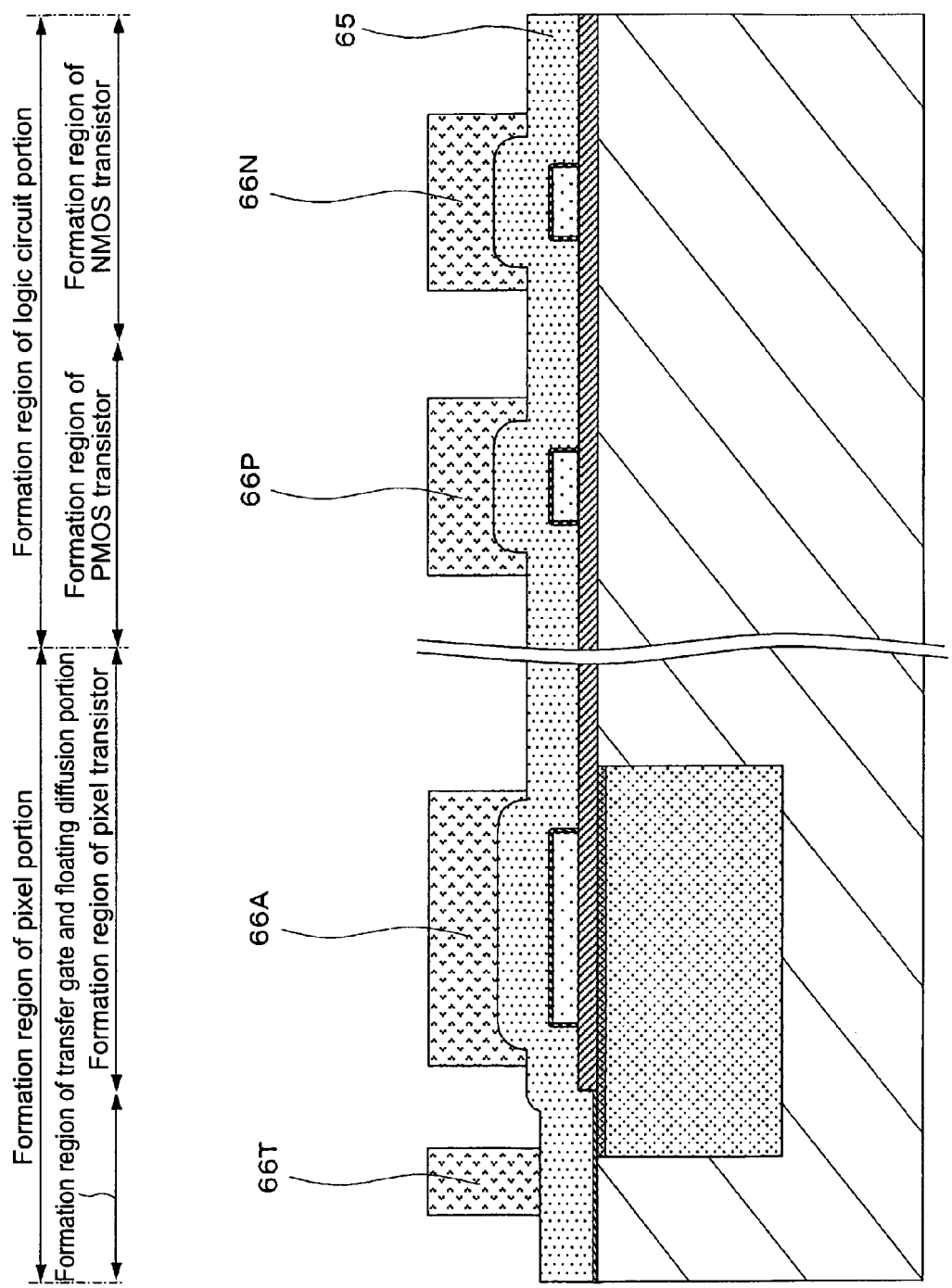
FIG. 21 is a manufacture-process cross-sectional diagram showing an example of a method of manufacturing the solid-state image pickup apparatus.

Next, as shown in FIG. 21, at a time when each of the gate electrodes of the transfer gate, the pixel transistor, and the PMOS and NMOS transistors is formed on the gate electrode formation film 65, resist patterns 66T, 66A, 66P, and 66N, each of which is used as an etching mask, are formed. For forming each of the resist patterns 66T, 66A, 66P, and 66N, a resist film is formed by a typical resist coating technique, and the resist film is patterned by the lithography technique.

(Formation of Gate Electrode)

Figure 22:
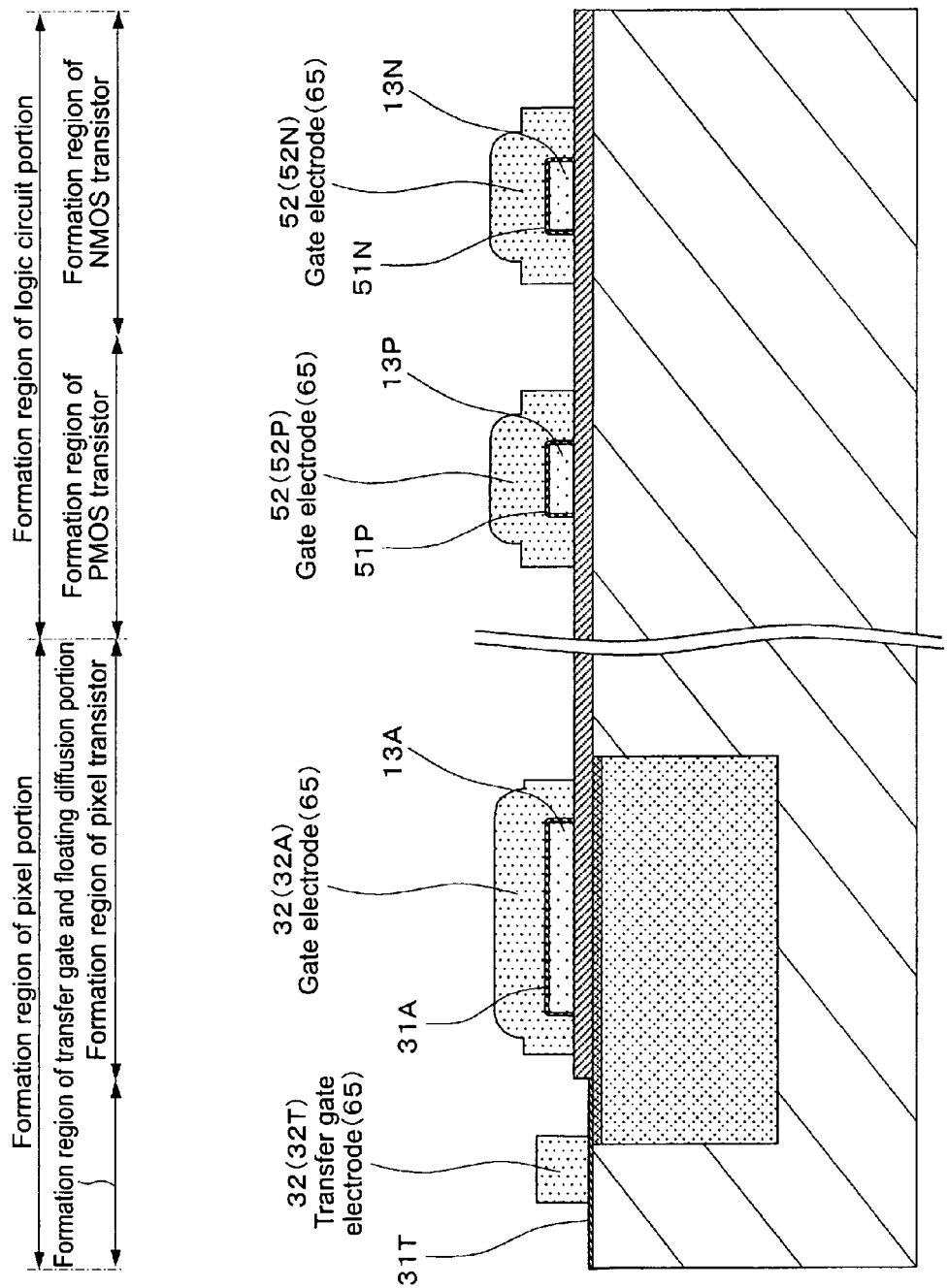
FIG. 22 is a manufacture-process cross-sectional diagram showing an example of a method of manufacturing the solid-state image pickup apparatus.

Next, as shown in FIG. 22, by performing a dry etching using the resist patterns 66T, 66A, 66P, and 66N (see, FIG. 21) as an etching mask, the gate electrode formation film 65 is patterned. As a result, the transfer gate electrode 32T is formed on the semiconductor substrate 11 through the gate insulating film 31T. In addition, the gate electrode 32A is formed through the gate insulating film 31A so as to stride the first silicon layer 13A of the pixel transistor portion. In addition, the gate electrode 52P is formed through the gate insulating film 51P so as to stride the second silicon layer 13P of the logic circuit portion, and the gate electrode 52N is formed through the gate insulating film 51N so as to stride the second silicon layer 13N.

(Formation of Sidewall)

Figure 23:
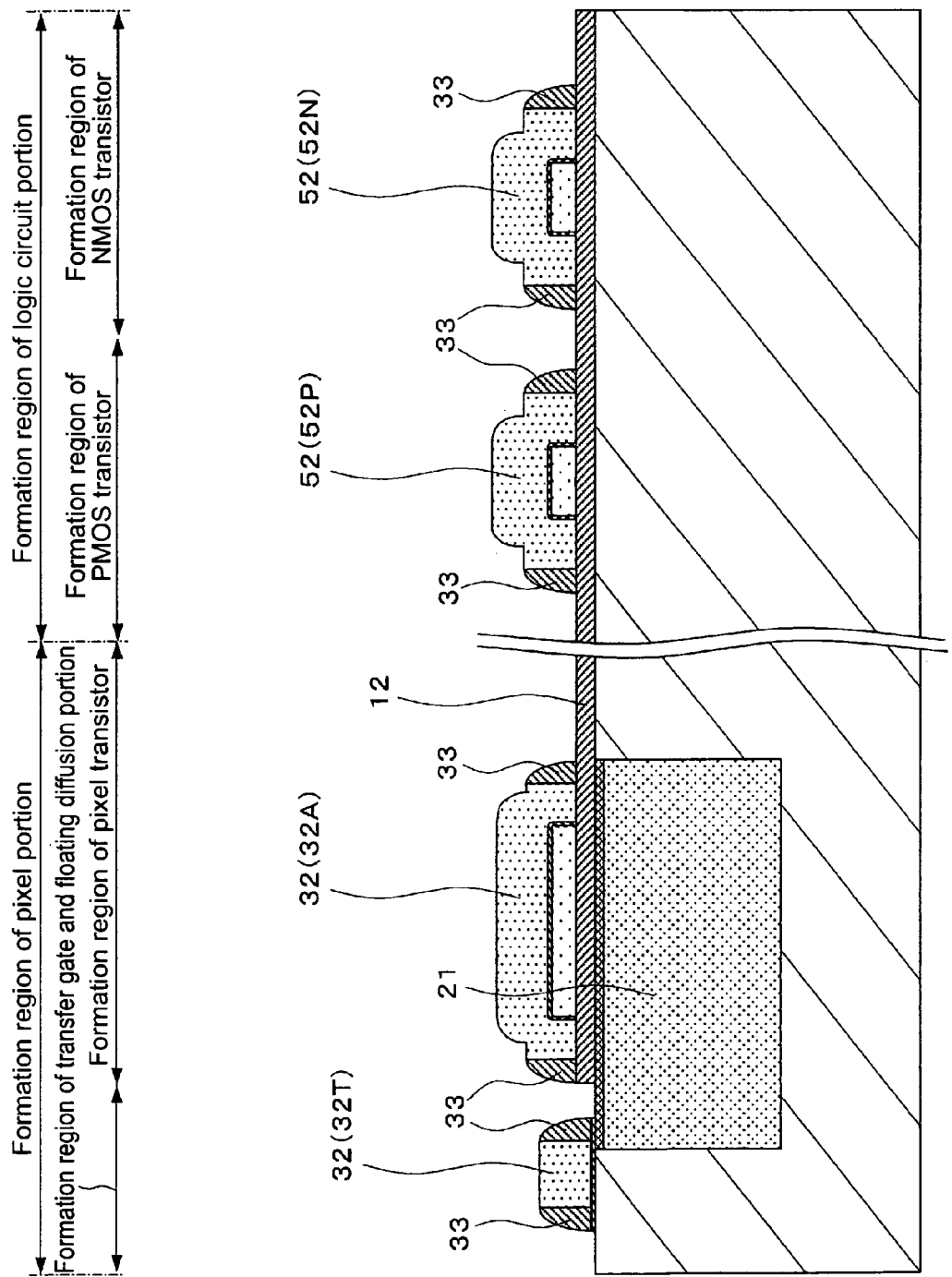
FIG. 23 is a manufacture-process cross-sectional diagram showing an example of a method of manufacturing the solid-state image pickup apparatus.

Next, as shown in FIG. 23, the sidewalls 33 are formed on the side portions of the transfer gate electrode 32 (32T), the gate electrode 32 (32A), the gate electrode 52 (52P), the gate electrode 52 (52N), respectively. The sidewalls 33 are formed by forming a silicon nitride film into a thickness of, for example, 100 nm so as to cover each of the gate electrodes 32, and then etching back the silicon nitride film.

At this time, most area on the photoelectric converter 21 is covered with the insulating layer 12, and therefore damage due to the etching for forming the sidewalls 33 is prevented from getting into the semiconductor substrate in which the photoelectric converter 21 is formed. Accordingly, it is possible to prevent a white spot, which can obtain a high-quality image.

It should be noted that, for preventing the white spot, it is desirable to cause the insulating layer 12 to be left up to a position of the formation region on which the transfer gate electrode 32T is formed, specifically, for example, up to a position overlapping the formation position of the sidewalls 33 formed around the transfer gate electrode 32T.

(Formation of Resist Pattern)

Figure 24:
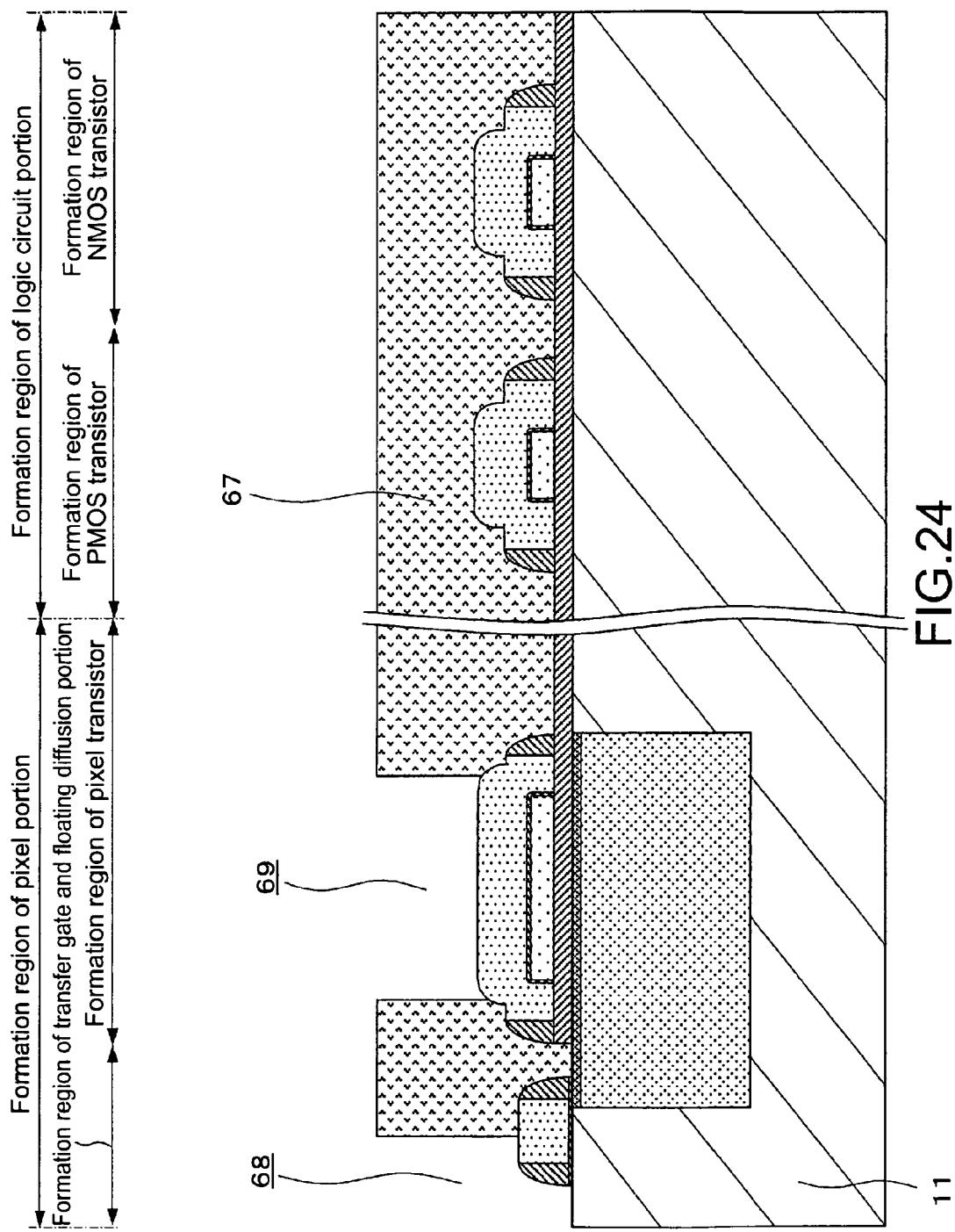
FIG. 24 is a manufacture-process cross-sectional diagram showing an example of a method of manufacturing the solid-state image pickup apparatus.

Next, as shown in FIG. 24, on the semiconductor substrate 11, a resist pattern 67 having opening portions 68 and 69 above the formation region of the floating diffusion portion and above the formation region of the pixel transistor is formed. For forming the resist pattern 67, a resist film is formed by a typical resist coating technique, and the resist film is patterned by the lithography technique.

At this time, a resist pattern for forming the source/drain regions of the pixel transistor is formed at the same time.

(Formation of Floating Diffusion and Source/Drain Regions)

Figure 25:
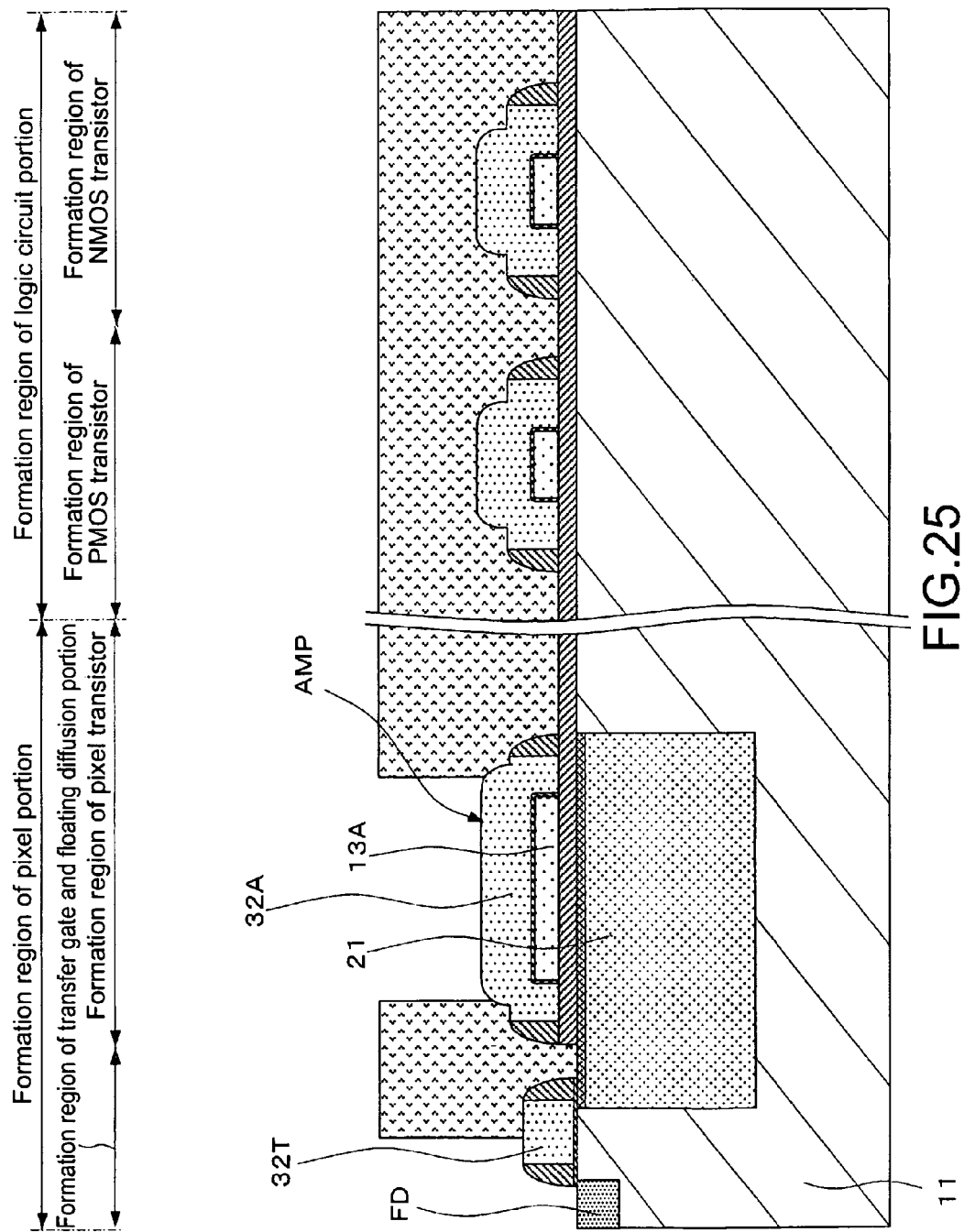
FIG. 25 is a manufacture-process cross-sectional diagram showing an example of a method of manufacturing the solid-state image pickup apparatus.
Figure 26:
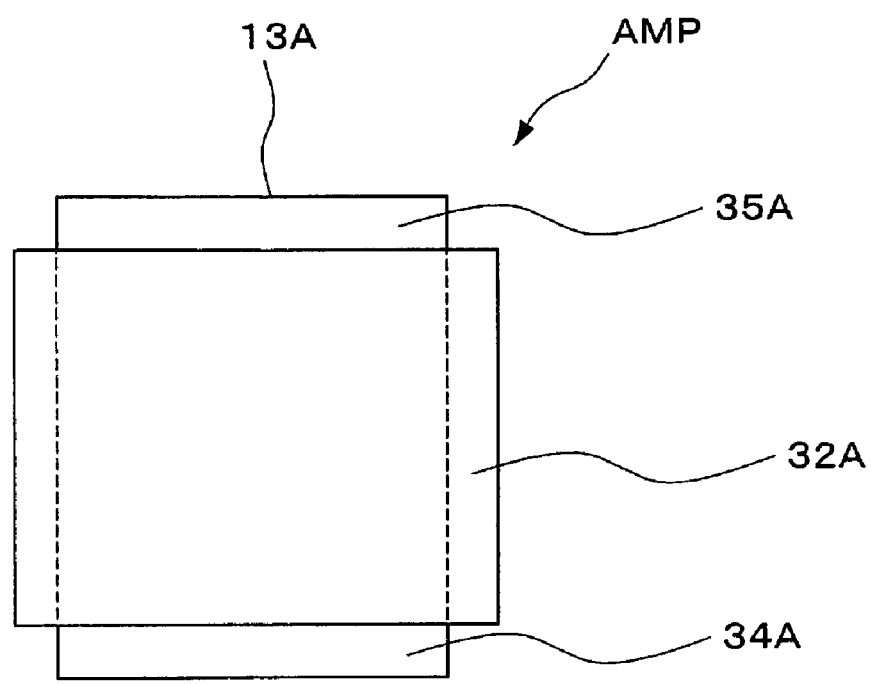
FIG. 26 is a partial planar layout diagram showing an example of a method of manufacturing the solid-state image pickup apparatus.

Next, as shown in FIG. 25 and a partial planar layout diagram of FIG. 26, the floating diffusion portion FD is formed on the semiconductor substrate 11 opposite to the photoelectric converter 21 of the transfer gate electrode 32T by the ion implantation method using the resist pattern 67 as a mask. At the same time, the source/drain regions of the pixel transistor are formed. FIG. 26 shows a state in which the source/drain regions 34A and 35A are formed on the first silicon layer 13A on both sides of the gate electrode 32A of the amplifier transistor AMP.

It should be noted that, although not shown, the source/drain regions of the reset transistor and the source/drain regions of the selection transistor are formed at the same time.

In the ion implantation, arsenic (As), phosphorus (P), or the like is used as one of ion implantation species, and a dose amount is set to $1*10^{15}/cm^2$ to $1*10^{16}/cm^2$, for example.

After that, the resist pattern 67 is removed.

It should be noted that the figure shows a state immediately before the resist pattern 67 is removed.

(Formation of Source/Drain Regions of Logic Circuit Portion)

Figure 27:
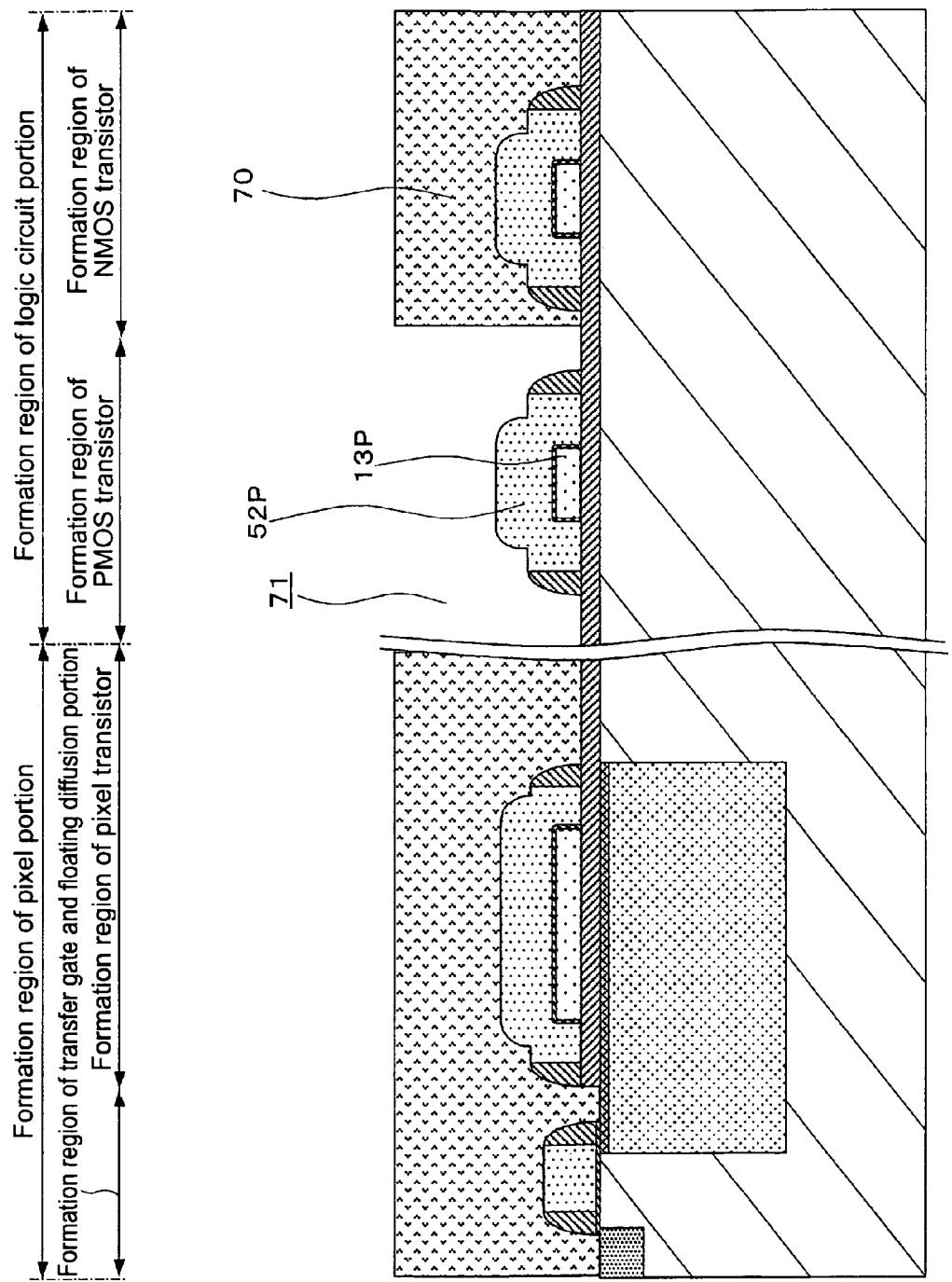
FIG. 27 is a manufacture-process cross-sectional diagram showing an example of a method of manufacturing the solid-state image pickup apparatus.
Figure 28:
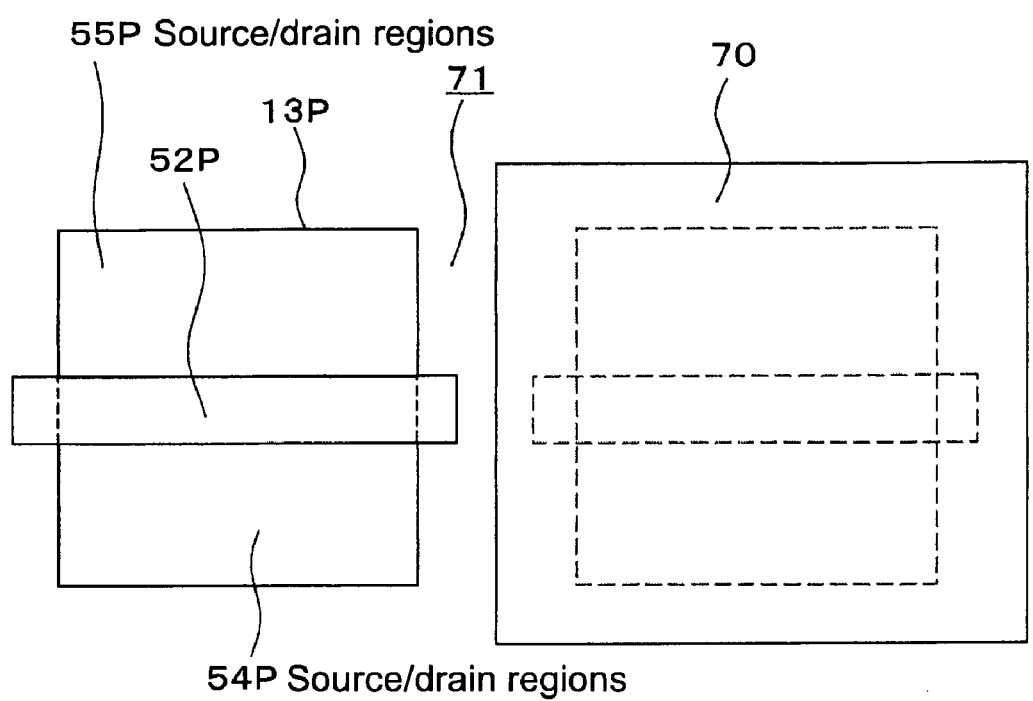
FIG. 28 is a partial planar layout diagram showing an example of a method of manufacturing the solid-state image pickup apparatus.

Next, as shown in FIG. 27 and a partial planar layout diagram of FIG. 28, a resist pattern 70 having an opening portion 71 above the formation region of the PMOS transistor is formed.

By the ion implantation method using the resist pattern 70 as a mask, the source/drain regions 54P and 55P are formed in the second silicon layer 13P on both sides of the gate electrode 52P.

In the ion implantation, boron (B), boron difluoride (BF2), or the like is used as one of ion implantation species, and a dose amount is set to $1*10^{15}/cm^2$ to $1*10^{16}/cm^2$, for example.

After that, the resist pattern 70 is removed.

It should be noted that the figure shows a state immediately before the resist pattern 70 is removed.

(Formation of Source/Drain Region of Logic Circuit Portion)

Figure 29:
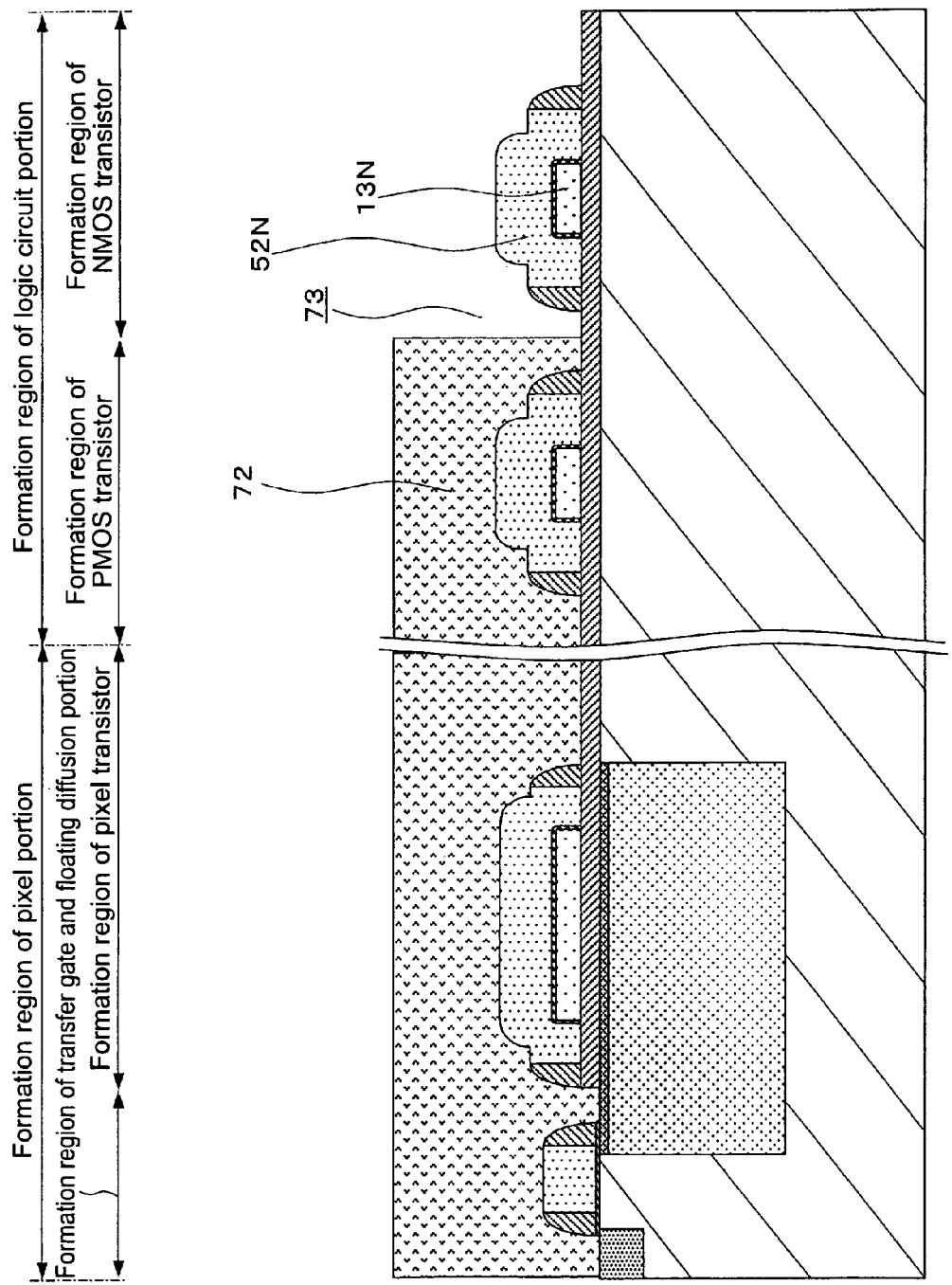
FIG. 29 is a manufacture-process cross-sectional diagram showing an example of a method of manufacturing the solid-state image pickup apparatus.
Figure 30:
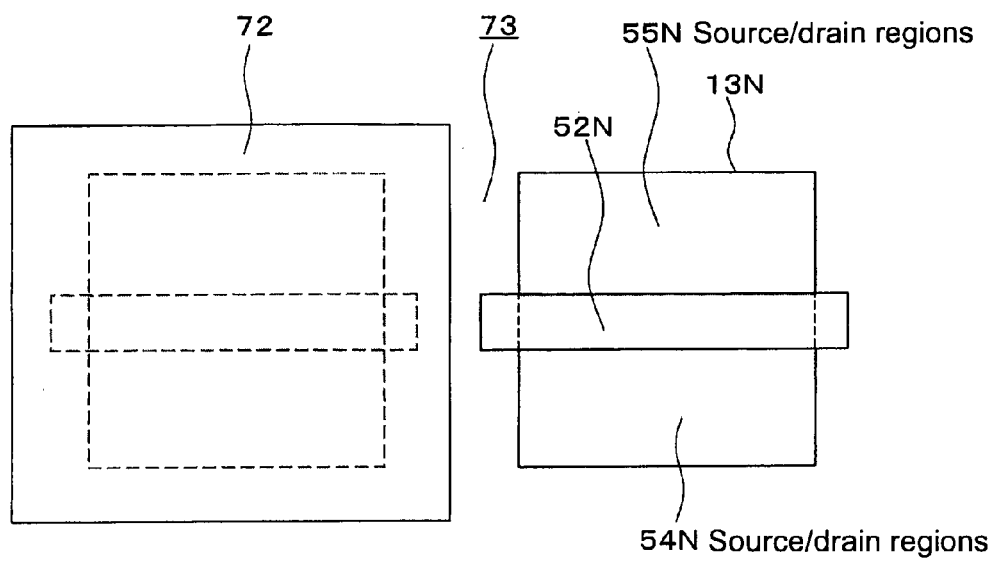
FIG. 30 is a partial planar layout diagram showing an example of a method of manufacturing the solid-state image pickup apparatus.

Next, as shown in FIG. 29 and a partial planar layout diagram of FIG. 30, a resist pattern 72 having an opening portion 73 above the formation region of the NMOS transistor is formed. By the ion implantation method using the resist pattern 72 as a mask, the source/drain regions 54N and 55N are formed in the second silicon layer 13N on both sides of the gate electrode 52N.

In the ion implantation, arsenic (As), phosphorus (P), or the like is used as one of ion implantation species, and a dose amount is set to $1*10^{15}/cm^2$ to $1*10^{16}/cm^2$, for example.

After that, the resist pattern 72 is removed.

It should be noted that the figure shows a state immediately before the resist pattern 72 is removed.

In the above description, the ion implantation for forming the source/drain regions 34A and 35A of the pixel transistor and forming the floating diffusion portion FD is performed first. However, for example, the ion implantation for forming the source/drain regions 54P and 55P may be performed first. Alternatively, the ion implantation for forming the source/drain regions 54N and 55N may be performed first. In other words, the order of the three ion implantation processes described above is not limited.

In addition, the ion implantation process for forming the source/drain regions 34A and 35A of the pixel transistor and forming the floating diffusion portion FD and the ion implantation for forming the source/drain regions 54N and 55N may be performed at the same time.

In addition the most area on the photoelectric converter 21 is covered with the insulating layer 12, and the resist patterns 67, 70, 72 used as the masks for the ion implantation for forming the source/drain regions are mostly formed through the insulating layer 12 on the photoelectric converter 21. Therefore, the resist patterns 67, 70, and 72 are not directly formed on the surface of the photoelectric converter 21, so the photoelectric converter 21 is prevented from being contaminated due to contaminants in the resist. Thus, it is possible to prevent the white spot, a dark current, or the like from increasing.

(Activation Annealing)

Figure 31:
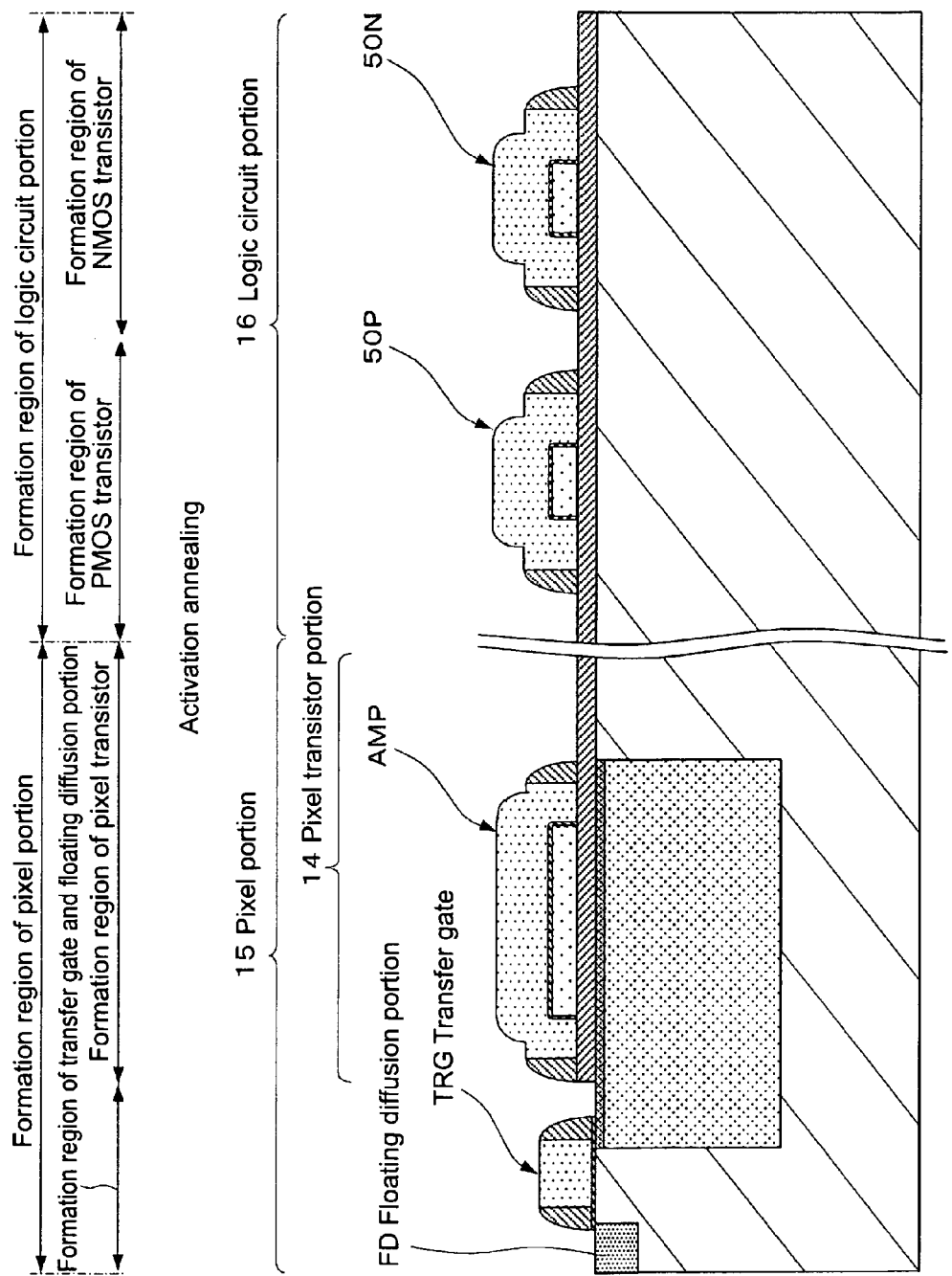
FIG. 31 is a manufacture-process cross-sectional diagram showing an example of a method of manufacturing the solid-state image pickup apparatus.

After that, as shown in FIG. 31, activation annealing is performed on the source/drain regions 34A and 35A, the floating diffusion portion FD, the source/drain regions 54P and 55P, and the source/drain regions 54N and 55N (see, FIG. 28, 30, etc.). The activation annealing is performed at about 800° C. to 1100° C. For an apparatus that performs the activation annealing, for example, an RTA (rapid thermal annealing) apparatus, a spike-RTA apparatus, or the like can be used.

In this way, the pixel transistor portion 14 (amplifier transistor AMP is shown in the figure) of the pixel unit 15, the floating diffusion portion FD, and the transfer gate TRG are formed. Further, the PMOS transistor 50P and NMOS transistor 50N of the logic circuit portion 16 are formed.

(Formation of Silicide Block Film)

Figure 32:
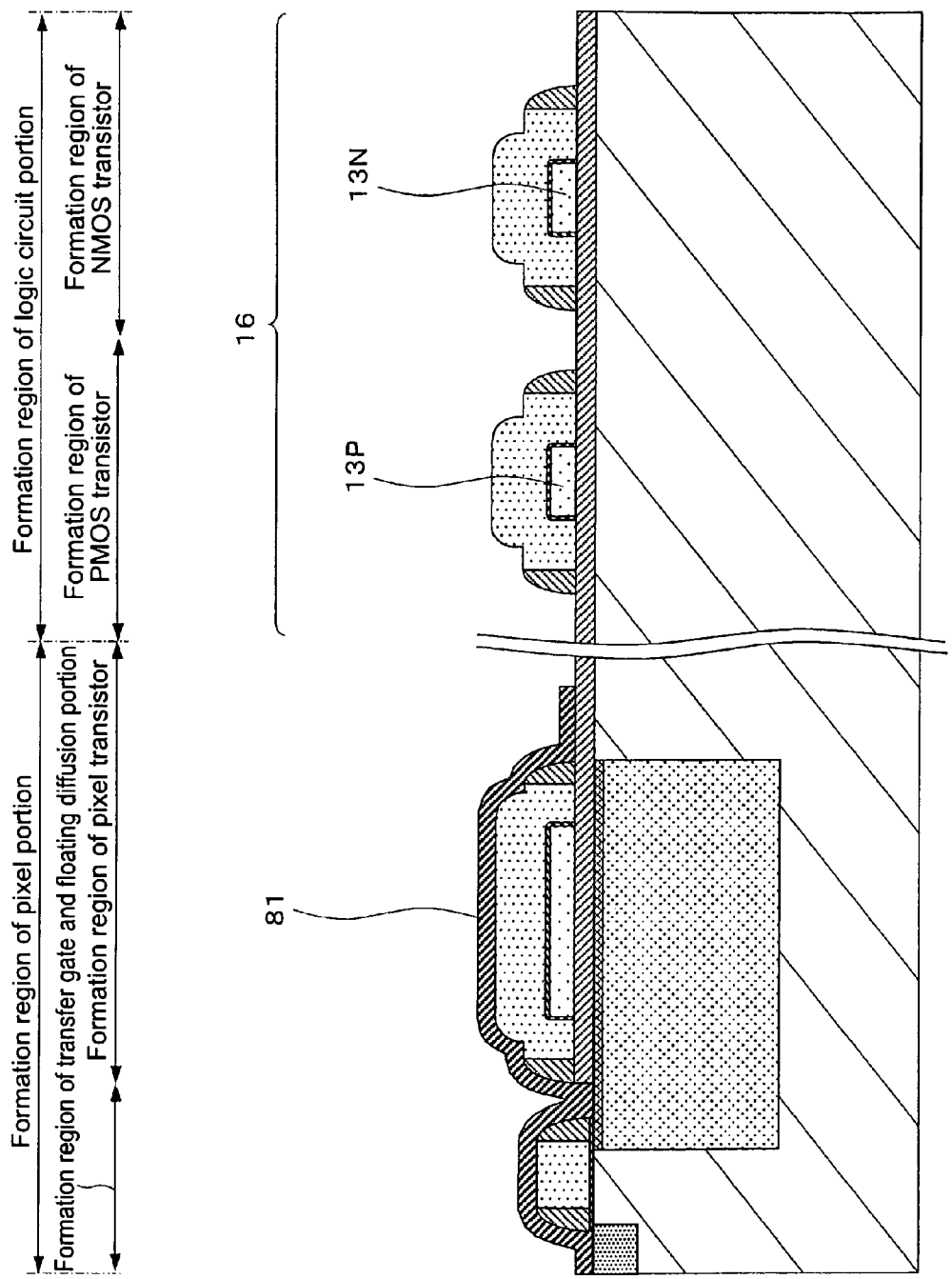
FIG. 32 is a manufacture-process cross-sectional diagram showing an example of a method of manufacturing the solid-state image pickup apparatus.

Next, as shown in FIG. 32, the silicide block film 81 is formed over the entire surface. The silicide block film 81 is formed of a silicon nitride film and has a thickness of 20 nm.

Subsequently, a resist mask (not shown) is formed on the silicide block film 81 on the formation region of the pixel portion. By performing etching with the resist mask, the silicide block film 81 is not removed so as to cover the formation region of the pixel portion, and the other area of the silicide block film 81 is etched and removed. It is desirable to perform wet etching so as not to damage the second silicon layers 13P and 13N in which the source/drain regions of the logic circuit portion 16 are formed.

(Formation of Silicide Layer)

Figure 33:
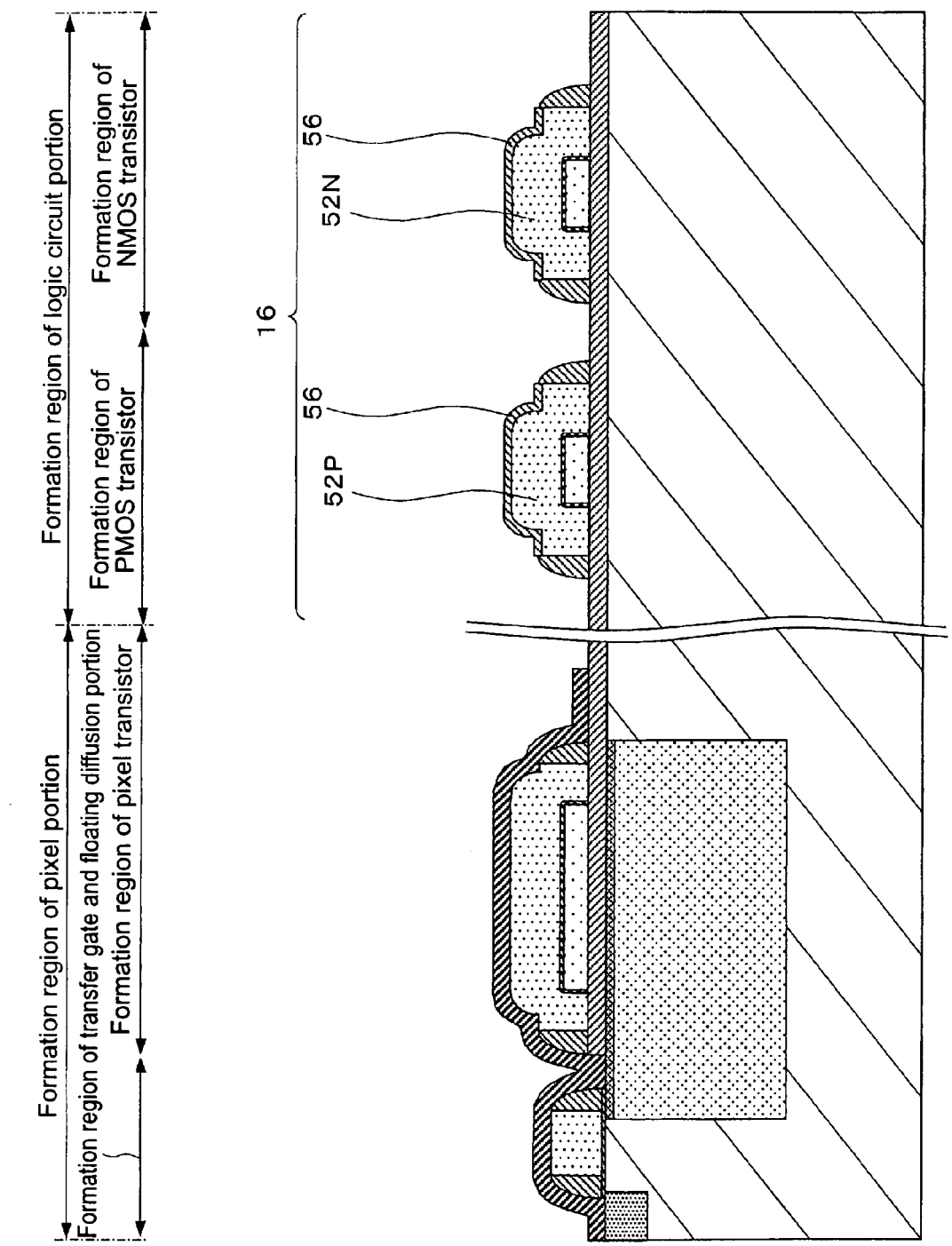
FIG. 33 is a manufacture-process cross-sectional diagram showing an example of a method of manufacturing the solid-state image pickup apparatus.

Next, as shown in FIG. 33, the silicide layer 56 is formed on the gate electrodes 52P and 52N of the logic circuit portion 16. At the same time, a similar silicide layer (not shown) is formed on each of the source/drain regions 54P and 55P (see, FIG. 28) and the source/drain regions 54N and 55N (see, FIG. 30). The silicide layer 56 and the like are formed of cobalt silicide or may be formed of nickel silicide, platinum silicide, or the like.

For forming the silicide layer 56, for example, a metal film that forms silicide over the surface, e.g., a cobalt film is formed. After that, a heat treatment is performed to cause cobalt of the cobalt film to react with silicon of the gate electrodes 52P and 52N, the source/drain regions 54P and 55P (see, FIG. 28), and the source/drain regions 54N and 55N (see, FIG. 30), thereby forming the cobalt silicide.

It should be noted that the surface of the active region is exposed to outside at the time when the sidewalls are formed.

(Formation of Interlayer Insulating Film and the Like)

Figure 34:
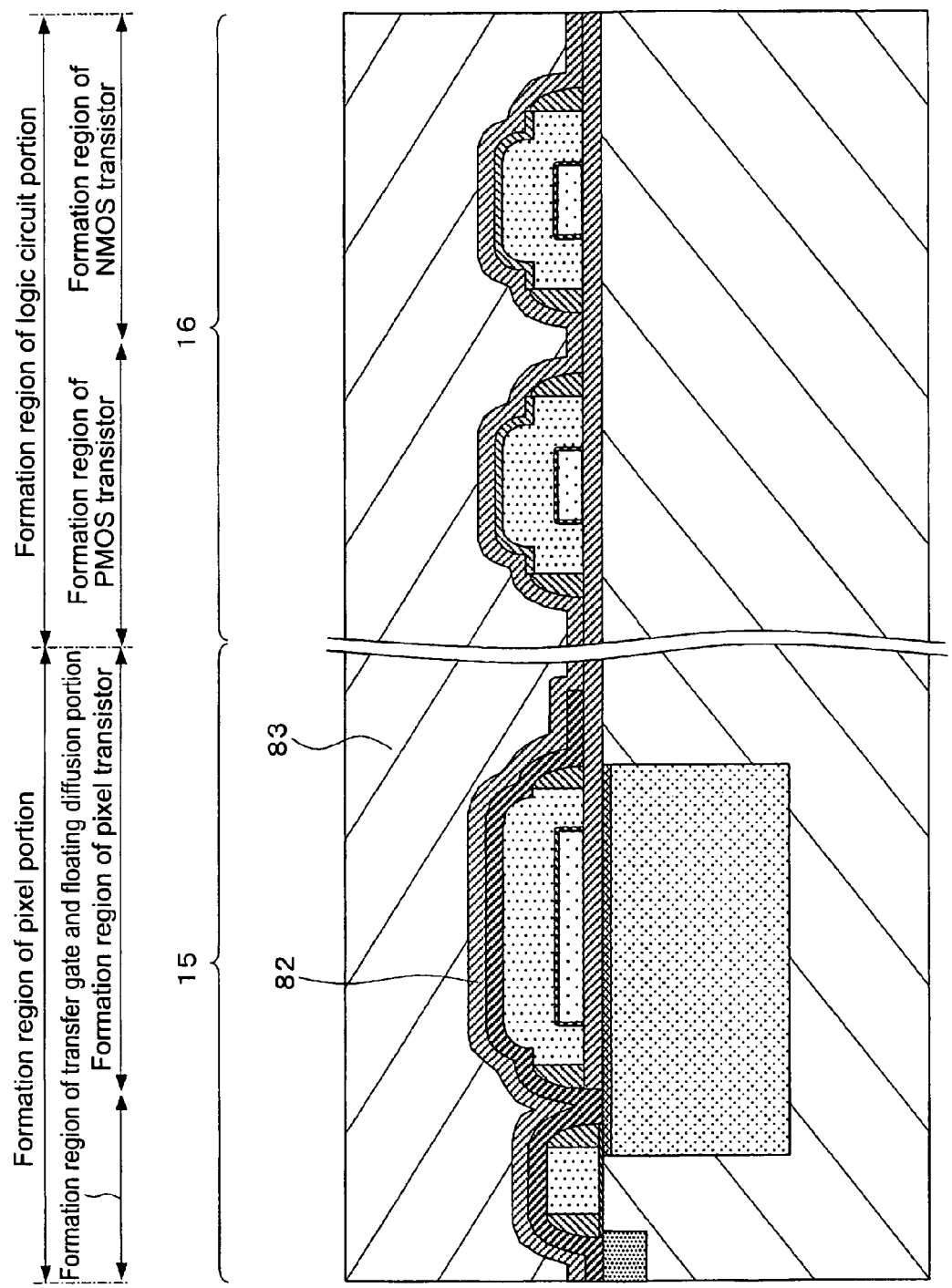
FIG. 34 is a manufacture-process cross-sectional diagram showing an example of a method of manufacturing the solid-state image pickup apparatus.

Next, as shown in FIG. 34, the etching stopper layer 82 and the interlayer insulating film 83 that cover the pixel portion 15 and the logic circuit portion 16 are formed. The etching stopper layer 82 is formed of a silicon nitride film by a plasma CVD method or the like and has a thickness of about 50 nm.

(Formation of Electrode and Wiring)

Figure 35:
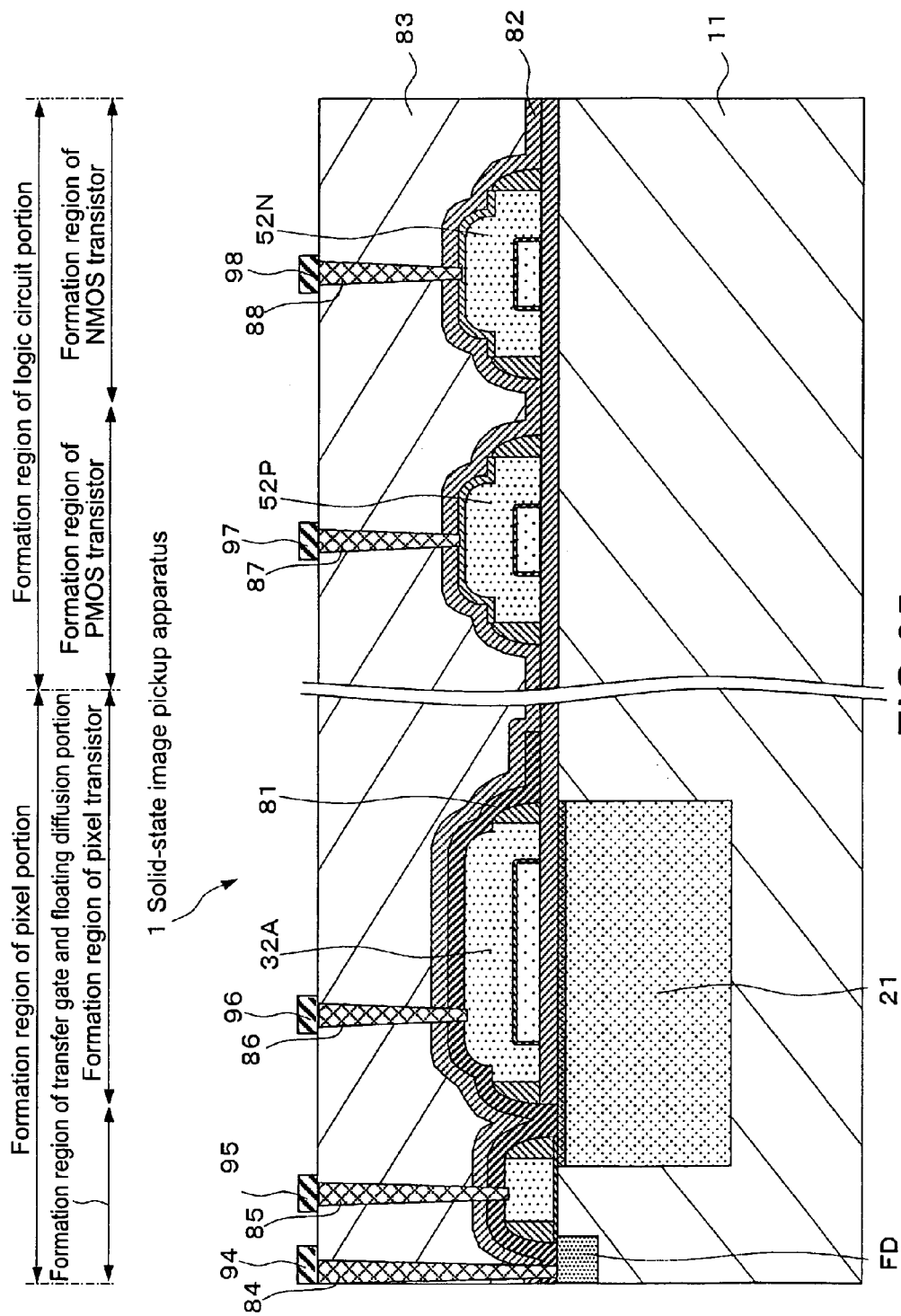
FIG. 35 is a manufacture-process cross-sectional diagram showing an example of a method of manufacturing the solid-state image pickup apparatus.

Next, as shown in FIG. 35, the electrodes connected to the floating diffusion portion FD, the gate electrodes of the transistors, the source/drain regions, and the like through the interlayer insulating film 83, the etching stopper layer 82, the silicide block film 81, and the like are formed. In the figure, the electrodes 84, 85, 86, 87, and 88 that are connected to the floating diffusion portion FD, the transfer gate electrode 32T, the gate electrode 32A of the amplifier transistor, the gate electrode 52P of the PMOS transistor, and the gate electrode 52N of the NMOS transistor, respectively, are shown as representative examples. In addition, the wirings 94, 95, 96, 97, and 98 that are connected to the electrodes 84, 85, 86, 87, and 88 are formed.

(Formation of Multilayer Wiring Layer, Support Substrate, Color Filter Layer, Micro Lens, and the Like)

In addition, although not shown, on the interlayer insulating film 83, a multilayer wiring layer is formed. The multilayer wiring layer has multilayer wirings and an electrode for connecting the wiring layers in the insulating layer. The surface of the insulating layer of the multilayer wiring layer is flattened, and the support substrate is bonded to the flattened surface.

On the other hand, on the side of the back surface of the semiconductor substrate 11, the semiconductor substrate 11 is removed up to the vicinity of the photoelectric converter 21 by, for example, a CMP (chemical mechanical polishing) method, thereby flatting the back surface of the semiconductor substrate 11.

Subsequently, an insulating film is formed on the back surface (that has been subjected to the removal by the CMP) of the semiconductor substrate 11, and the color filter layer, the micro lens, and the like are formed on the insulating film.

In this way, the solid-state image pickup apparatus 2 is formed.

In the above-described method of the solid-state image pickup apparatus 2, the photoelectric converter 21 is formed on the surface side in the semiconductor substrate 11. Therefore, the P-N junction having the steep concentration profile can be formed.

It should be noted that the photoelectric converter 21 is formed by performing the ion implantation on the semiconductor substrate 11 through the silicon layer 13 and the insulating layer 12, but the P-N junction having the steep concentration profile can be formed. This is because the silicon layer 13 and the insulating layer 12 have a thin thickness of 100 nm to 200 nm in total.

Further, the photoelectric converter 21 is formed in the semiconductor substrate 11 under the insulating layer 12, and the pixel transistor portion 14 is formed on the insulating layer 12. Therefore, the sizes of the photoelectric converter 21 and the amplifier transistor AMP can be maximized. For example, the area of the amplifier transistor AMP of the pixel transistor can be set to be almost the same as that of the photoelectric converter 21. Accordingly, the increase in the saturation charge amount and the reduction in the noise can be realized at the same time.

As a result, by the method of manufacturing the solid-state image pickup apparatus 2, it is possible to realize the increase in the saturation charge amount and the reduction in the noise at the same time, and therefore there is an advantage in that an image having a high sensitivity and a high quality can be obtained.

It should be noted that, in a case where the process of forming the logic circuit portion 16 is omitted in the manufacturing method described above, the solid-state image pickup apparatus 1 described in the first example of the solid-state image pickup apparatus is formed.

Further, in the description of the embodiments, the structure in which the one pixel transistor portion performs the processing on the signal charge read from the one photoelectric converter is used. The present invention can also be applied to a structure in which one pixel transistor portion performs the processing on signal charges read from two photoelectric converters, that is, a two-pixel-sharing structure. In addition, the present invention can also be applied to a structure in which one pixel transistor portion performs the processing on signal charges read from four photoelectric converters, that is, a four-pixel-sharing structure.

(Application Example of Solid-State Image Pickup Apparatus)

A description will be given on an example of a structure of an image pickup apparatus to which the solid-state image pickup apparatus according to the embodiment of the present invention with reference to a block diagram of FIG. 36.

Figure 36:
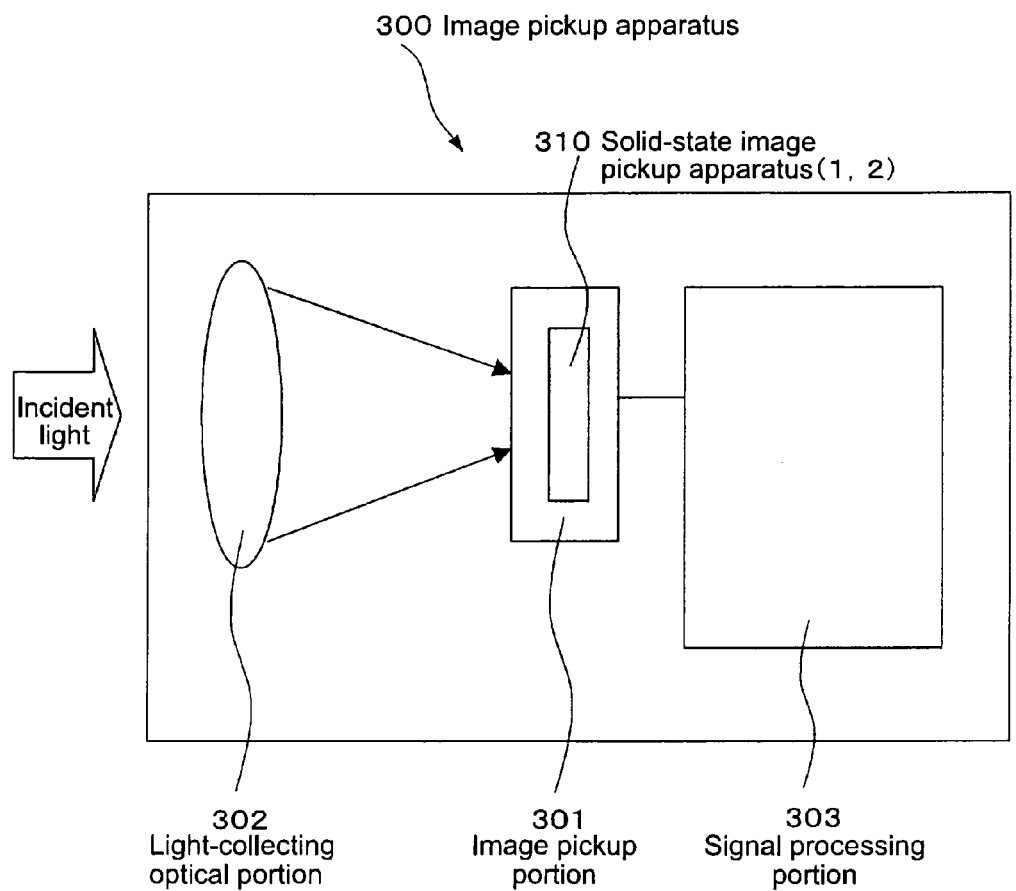
FIG. 36 is a block diagram showing an image pickup apparatus showing an application example of the solid-state image pickup apparatus according to an embodiment of the present invention.
Figure 37A:
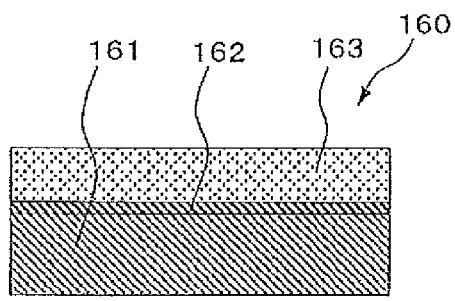
FIG. 37 are manufacture-process cross-sectional diagrams each showing an example of a method of manufacturing a solid-state image pickup apparatus in related art.
Figure 37D:
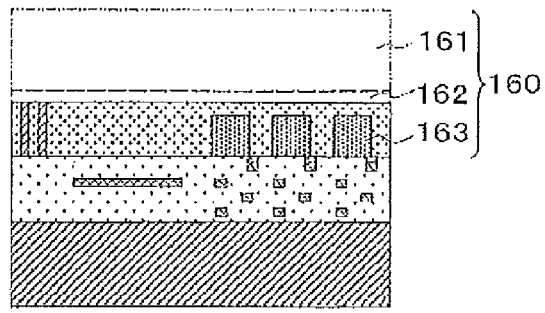
Figure 37B:
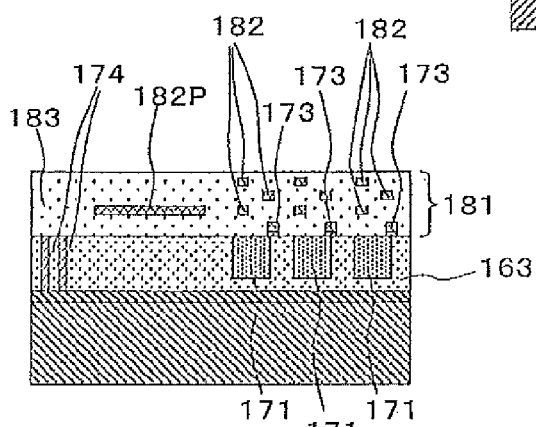
Figure 37C:
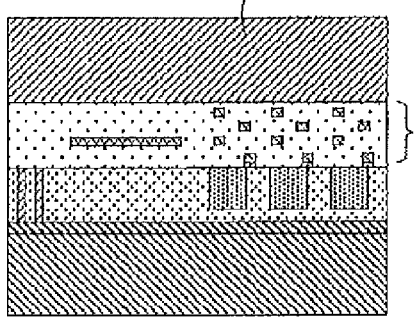
Figure 37E:
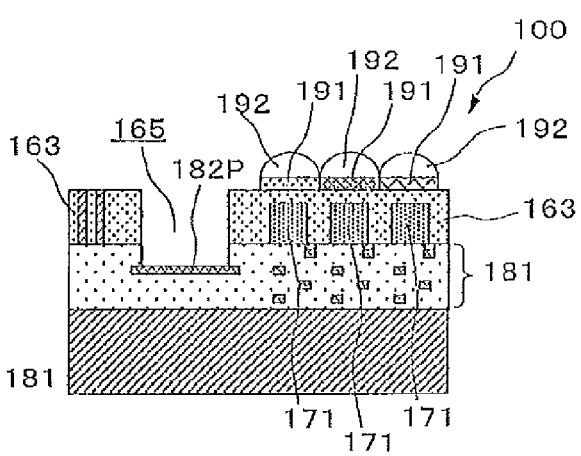
Figure 38:
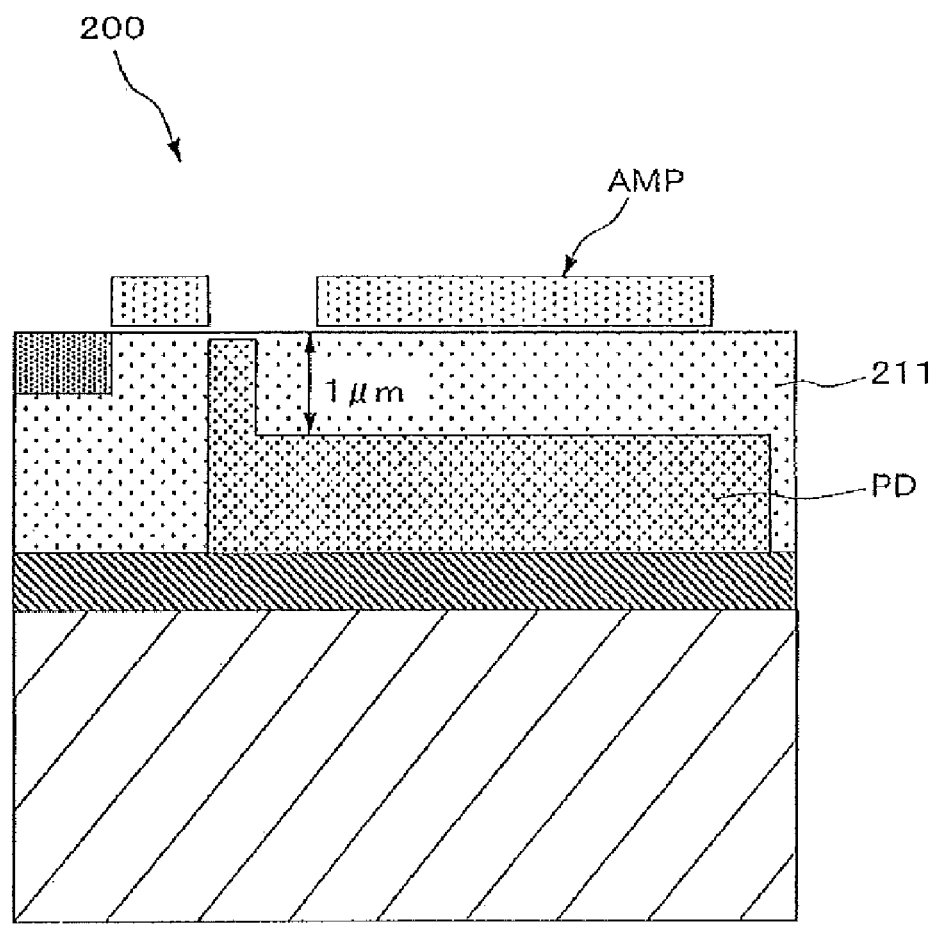
FIG. 38 is a schematic cross-sectional diagram showing an example of a structure of the solid-state image pickup apparatus in related art.

As shown in FIG. 36, an image pickup apparatus 300 includes a solid-state image pickup apparatus 310 in an image pickup portion 301. On a light collecting side of the image pickup portion 301, a light-collecting optical portion 302 that forms an image is provided. Further, to the image pickup portion 301, connected is a signal processing portion 303 having a drive circuit that drives the image pickup portion 301 and a signal processing circuit or the like that performs an image processing on a signal that has been subjected to the photoelectric conversion in the solid-state image pickup apparatus. In addition, an image signal that has been subjected to the processing in the signal processing portion 303 can be stored in an image storage portion (not shown). In the image pickup apparatus 300 as described above, the solid-state image pickup apparatus 1 or 2 can be used for the solid-state image pickup apparatus 310.

In the image pickup apparatus 300 of the embodiment of the present invention, the solid-state image pickup apparatus 1 or 2 according to the present invention is used. Therefore, it is possible to realize the increase in saturation charge amount and the reduction in noise in the solid-state image pickup apparatus 310 at the same time, and thus there is an advantage in that an image having a high sensitivity and a high quality can be obtained.

The image pickup apparatus 300 may have a one-chip form or a module-like form in which an image pickup function in which the image pickup portion and the signal processing portion or the optical system are collectively packaged is implemented. In addition, the solid-state image pickup apparatuses 1 and 2 according to the present invention can also be applied to an image pickup apparatus as described above. Here, the image pickup apparatus refers to a mobile apparatus having a camera, an image pickup function, or the like. Further, the meaning of "picking up an image" broadly includes fingerprint detection, in addition to picking up an image at a time of general shooting with a camera.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup apparatus, comprising:
   a semiconductor substrate;
   a photoelectric converter to convert light energy of incident light into electrical energy and obtain a signal charge, the photoelectric converter being formed on a surface side in the semiconductor substrate;
   a transfer gate to read the signal charge from the photoelectric converter, the transfer gate being formed on the semiconductor substrate adjacent to the photoelectric converter;
   an insulating layer formed on the photoelectric converter in the semiconductor substrate;
   a first silicon layer formed on the insulating layer; and
   a pixel transistor portion to amplify and output the signal charge read by the transfer gate, the pixel transistor portion being formed on the insulating layer with the first silicon layer being an active region,
   wherein the thickness of the insulating layer is in the range of 50 nm to 100 nm, and the thickness of the first silicon layer is in the range of 50 nm to 100 nm.

2. The solid-state image pickup apparatus according to claim 1,
   wherein the pixel transistor portion includes a reset transistor, an amplifier transistor, and a selection transistor, the amplifier transistor having the active region disposed on the photoelectric converter in a planar layout.

3. The solid-state image pickup apparatus according to claim 1,
   wherein the insulating layer is also formed on the semiconductor substrate in a vicinity of the photoelectric converter,
   the solid-state image pickup apparatus further comprising:
   a second silicon layer formed on the insulating layer on the semiconductor substrate except a formation area of the photoelectric converter; and
   a logic circuit portion formed on the insulating layer with the second silicon layer being as an active region.

4. The solid-state image pickup apparatus according to claim 3,
   wherein the pixel transistor portion has a pixel transistor, and the logic circuit portion has a transistor, the pixel transistor and the transistor of the logic circuit portion each being formed of a FinFET.

\* \* \* \* \*